US008742263B2

(12) United States Patent
Tomita et al.

(10) Patent No.: US 8,742,263 B2
(45) Date of Patent: Jun. 3, 2014

(54) ANISOTROPICALLY CONDUCTIVE MEMBER AND METHOD FOR PRODUCING THE SAME

(75) Inventors: Tadabumi Tomita, Haibara-gun (JP); Yusuke Hatanaka, Haibara-gun (JP); Shinya Suzuki, Haibara-gun (JP); Atsushi Matsuura, Haibara-gun (JP); Yoshinori Hotta, Haibara-gun (JP); Akio Uesugi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 138 days.

(21) Appl. No.: 13/201,784

(22) PCT Filed: Feb. 17, 2010

(86) PCT No.: PCT/JP2010/052357
§ 371 (c)(1),
(2), (4) Date: Aug. 16, 2011

(87) PCT Pub. No.: WO2010/095653
PCT Pub. Date: Aug. 26, 2010

(65) Prior Publication Data

US 2012/0168218 A1 Jul. 5, 2012

(30) Foreign Application Priority Data

Feb. 17, 2009 (JP) ................................ 2009-034074

(51) Int. Cl.
*H05K 1/11* (2006.01)

(52) U.S. Cl.
USPC ........................................................ 174/262

(58) Field of Classification Search
USPC ...................................... 174/262; 439/65, 91
See application file for complete search history.

(56) References Cited

U.S. PATENT DOCUMENTS 5,281,771 A * 1/1994 Swift et al. .................... 174/262
5,379,515 A 1/1995 Kondo et al.

(Continued)

FOREIGN PATENT DOCUMENTS

JP 3-182081 A 8/1991
JP 4-087213 A 3/1992

(Continued)

OTHER PUBLICATIONS

Notification of Reasons for Refusal, dated Sep. 4, 2012, issued in corresponding JP Application No. 2009-034074, 3 pages in English and Japanese.
International Preliminary Report on Patentability and Written Opinion, dated Oct. 4, 2011, issued in corresponding International Application No. PCT/JP2010/052357, six pages in English.

*Primary Examiner* — Chau N Nguyen
(74) *Attorney, Agent, or Firm* — Sughrue Mion, PLLC

(57) ABSTRACT

Provided is an anisotropically conductive member that has a dramatically increased density of disposed conductive paths, can be used as an electrically connecting member or inspection connector for electronic components such as semiconductor devices even today when still higher levels of integration have been achieved, and has excellent flexibility. The anisotropically conductive member includes an insulating base and a plurality of conductive paths made of a conductive material, insulated from one another, and extending through the insulating base in the thickness direction of the insulating base, one end of each of the conductive paths protruded on one side of the insulating base, the other end of each of the conductive paths exposed or protruded on the other side thereof. The insulating base is made of a resin material and the conductive paths are formed at a density of at least 1,000,000 conductive paths/$mm^2$.

2 Claims, 7 Drawing Sheets

(56) References Cited

U.S. PATENT DOCUMENTS

| | | | | |
|---|---|---|---|---|
| 7,052,763 | B2 * | 5/2006 | Swift et al. | 428/300.4 |
| 7,220,131 | B1 * | 5/2007 | Pecht et al. | 439/65 |
| 2005/0077542 | A1 | 4/2005 | Asai et al. | |
| 2008/0284042 | A1 | 11/2008 | Hotta et al. | |

FOREIGN PATENT DOCUMENTS

| | | | |
|---|---|---|---|
| JP | 2000-012619 | A | 1/2000 |
| JP | 2005-085634 | A | 3/2005 |
| JP | 2008-270157 | A | 11/2008 |
| JP | 2008-270158 | A | 11/2008 |

* cited by examiner

ANISOTROPICALLY CONDUCTIVE MEMBER AND METHOD FOR PRODUCING THE SAME

TECHNICAL FIELD

The present invention relates to an anisotropically conductive member and a method of producing the same.

BACKGROUND ART

An anisotropically conductive member, when inserted between an electronic component such as a semiconductor device and a circuit board, then subjected to merely the application of pressure, is able to provide an electrical connection between the electronic component and the circuit board. Accordingly, such members are widely used, for example, as electrically connecting members in semiconductor devices and other electronic components and as inspection connectors when carrying out functional inspections.

In particular, owing to the remarkable degree of miniaturization that has occurred in electronically connecting members for semiconductor devices and the like, it becomes difficult to further reduce the wire diameter in conventional techniques such as wire bonding that involve the direct connection of an interconnect substrate.

This situation has drawn attention in recent years to anisotropically conductive members of a type in which an array of electrically conductive elements pass completely through a film of insulating material, or of a type in which metal balls are arranged in a film of insulating material.

Inspection connectors for semiconductor devices and the like have been used to avoid the large monetary losses that are incurred when, upon carrying out functional inspections after an electronic component such as a semiconductor device has been mounted on a circuit board, the electronic component is found to be defective and the circuit board is discarded together with the electronic component.

That is, by bringing electronic components such as semiconductor devices into electrical contact with a circuit board through an anisotropically conductive member at positions similar to those to be used during mounting and carrying out functional inspections, it is possible to perform the functional inspections without mounting the electronic components on the circuit board, thus enabling the above problem to be avoided.

In connection with such anisotropically conductive member, Patent Literature 1 discloses "a method of manufacturing an electrically connecting member having a retaining body made of an electrically insulating material and a plurality of conductive elements provided in a mutually insulating state within the retaining body, wherein an end of each conductive element is exposed on a side of the retaining body and the other end of each conductive element is exposed on the other side of the retaining body, the method comprising:

a first step of exposing a matrix having a base and an insulating layer which, when deposited on the base, forms the retaining body to a high energy beam from the insulating layer side, thereby removing all of the insulating layer and part of the base in a plurality of regions so as to form a plurality of holes in the matrix;

a second step of filling the plurality of formed holes with a conductive material for forming the conductive elements so as to be flush with the sides of the insulating layer or to protrude from the sides; and a third step of removing the base." Patent Literature 1 also carries out investigations on various materials (e.g., polyimide resins, epoxy resins and silicone resins) for the insulating layer.

Patent Document 2 discloses "an anisotropically conductive film comprising a film substrate composed of an adhesive insulating material and a plurality of conductive paths composed of a conductive material which are arrayed within the film substrate in a mutually insulated state and pass entirely through the film substrate in a thickness direction thereof, wherein the conductive paths have shapes, in a cross-section parallel to a lengthwise direction of the film substrate, with circumferences having thereon an average maximum length between two points of from 10 to 30 μm, and wherein neighboring conductive paths have intervals therebetween which are from 0.5 to 3 times the average maximum length."

Patent Document 3 discloses "an anisotropically conductive film comprising a film base composed of an insulating resin and a plurality of conductive paths which are mutually insulated, pass entirely through the film base in a thickness direction thereof and are positioned in staggered rows, wherein conductive paths in mutually neighboring conductive path rows have a smaller distance therebetween than conductive paths within a single row of conductive paths."

However, with the increasing trend in recent years toward higher integration, electrode (terminal) sizes in electronic components such as semiconductor devices are becoming smaller, the number of electrodes (terminals) is increasing, and the distance between terminals is becoming smaller. Moreover, there have also appeared electronic components having a surface construction wherein the surface on each of the numerous terminals arranged at a narrow pitch lies at a position that is more recessed than the surface of the component itself.

In order to be able to adapt to such electronic components, there has arisen a need to make the outer diameter (thickness) of the conductive paths in anisotropically conductive members smaller and to arrange the conductive paths at a narrower pitch.

However, in the methods of producing the electrically connecting members and the anisotropically conductive films described in Patent Literatures 1 to 3, it has been very difficult to reduce the size of the conductive paths.

The applicant of Patent Literature 4 proposes a method of producing an anisotropically conductive member which includes an insulating base and a plurality of conductive paths made of a conductive material, insulated from one another, and extending through the insulating base in the thickness direction of the insulating base at a density of at least 10,000,000 conductive paths/$mm^2$, one end of each of the conductive paths being exposed on one side of the insulating base, and the other end of each of the conductive paths being exposed on the other side thereof, the method comprising at least:

(1) an anodizing treatment step in which an aluminum substrate is anodized to form a micropore-bearing alumina film;

(2) a perforating treatment step in which micropores formed by anodization are perforated after the anodizing treatment step to obtain an insulating base; and (3) a conductive material filling step in which a conductive material is filled into through micropores in the resulting insulating base after the perforating treatment step to obtain the anisotropically conductive member.

Patent Literature 5 describes an anisotropically conductive member which has an insulating base and a plurality of conductive paths made of a conductive material, insulated from one another, and extending through the insulating base in a thickness direction of the insulating base, one end of each of the conductive paths exposed on one side of the insulating base, and the other end of each of the conductive paths exposed on the other side of the insulating base, wherein the conductive paths are formed at a density of 2,000,000 conductive paths/$mm^2$ or more, and the insulating base is a structure composed of an anodized film of an aluminum substrate having micropores.

CITATION LIST

Patent Literature

Patent Literature 1: JP 03-182081 A;
Patent Literature 2: JP 2000-012619 A;
Patent Literature 3: JP 2005-085634 A;
Patent Literature 4: JP 2008-270157 A;
Patent literature 5: JP 2008-270158 A;

SUMMARY OF INVENTION

Technical Problems

However, it has been found that the anisotropically conductive members described in Patent Literatures 4 and 5 each includes the insulating base made of an anodized aluminum film and can be therefore appropriately used in highly flat substrates such as silicon wafers but are not sufficiently flexible to follow the deformation of flexible substrates such as flexible printed circuits (FPCs) made of resins and their suitable use may often be difficult.

Accordingly, an object of the invention is to provide an anisotropically conductive member that dramatically increases the density of disposed conductive paths, can be used as an electrically connecting member or inspection connector for electronic components such as semiconductor devices even today when still higher levels of integration have been achieved and has excellent flexibility. Another object of the invention is to provide a method of producing such an anisotropically conductive member.

Solution to Problems

The inventors of the invention have made an intensive study to achieve the above objects and as a result found that the density of disposed conductive paths is dramatically increased and excellent flexibility is imparted to the anisotropically conductive member by using the aluminum anodization technology to form micropores, forming conductive paths from the micropores and substituting the anodized film with a resin material. The invention has been thus completed.

Accordingly, the invention provides the following (i) to (iv).

(i) An anisotropically conductive member comprising: an insulating base and a plurality of conductive paths made of a conductive material, insulated from one another, and extending through the insulating base in a thickness direction of the insulating base, one end of each of the conductive paths protruded on one side of the insulating base, the other end of each of the conductive paths exposed or protruded on the other side thereof, wherein the insulating base is made of a resin material and the conductive paths are formed at a density of at least 1,000,000 conductive paths/$mm^2$.

(ii) The anisotropically conductive member according to (i), wherein protrusions of the conductive paths from a surface of the insulating base have a height of 0.05 to 30 μm and an aspect ratio (height/diameter) of at least 1.

(iii) The anisotropically conductive member according to (i) or (ii), having an insulating base thickness of from 20 to 200 μm and a conductive path diameter of from 20 to 500 nm.

(iv) An anisotropically conductive member-producing method for producing the anisotropically conductive member according to any one of (i) to (iii), comprising, at least:

(1) an anodizing treatment step in which an aluminum substrate is anodized to form an anodized film;

(2) a perforating treatment step in which micropores formed by anodization are perforated after the anodizing treatment step to obtain a microstructure;

(3) a conductive material filling step in which a conductive material is filled into through micropores in the resulting microstructure after the perforating treatment step to form the conductive paths;

(4) a conductive path-protruding step in which the conductive paths are protruded from a front surface or back surface of the microstructure after the conductive material filling step to obtain an anisotropically conductive member precursor;

(5) a resin coating step in which at least part of the front surface or the back surface of the anisotropically conductive member precursor is coated with a solvent-soluble resin after the conductive path-protruding step;

(6) a film removal step in which the anodized film of the anisotropically conductive member precursor is removed after the resin coating step;

(7) a resin filling step in which a portion in which the anodized film was formed is filled with a solvent-insoluble resin after the film removal step to form the insulating base; and (8) a resin removal step in which the solvent-soluble resin is removed after the resin filling step to obtain the anisotropically conductive member.

Advantageous Effects of Invention

As will be described later, the invention can provide an anisotropically conductive member that has a dramatically increased density of disposed conductive paths, can be used as an electrically connecting member or inspection connector for electronic components such as semiconductor devices even today when still higher levels of integration have been achieved, and has excellent flexibility, as well as a method of producing such an anisotropically conductive member.

The anisotropically conductive member of the invention has a large number of conductive paths joined to an electrode (pad) portion of an electronic component and the pressure is dispersed, and therefore damage to the electrode can be reduced. Since the large number of conductive paths are connected to (in contact with) the single electrode, the influence on the whole confirmation of the conductivity is minimized even in the event of failure in part of the conductive paths. In addition, the load on the positioning of an evaluation circuit board can be considerably reduced.

In addition, the anisotropically conductive member-producing method of the invention is capable of efficiently producing the anisotropically conductive member of the invention and is therefore very useful.

DESCRIPTION OF EMBODIMENTS

Next, the anisotropically conductive member and its production method according to the invention are described in detail.

The anisotropically conductive member of the invention has an insulating base and a plurality of conductive paths made of a conductive material, insulated from one another, and extending through the insulating base in the thickness direction of the insulating base, one end of each of the conductive paths protruded on one side of the insulating base, the other end of each of the conductive paths exposed or protruded on the other side thereof, wherein the insulating base is made of a resin material and the conductive paths are formed at a density of at least 1,000,000 conductive paths/$mm^2$.

Next, the anisotropically conductive member of the invention is described with reference to FIG. 1.

Figure 1:
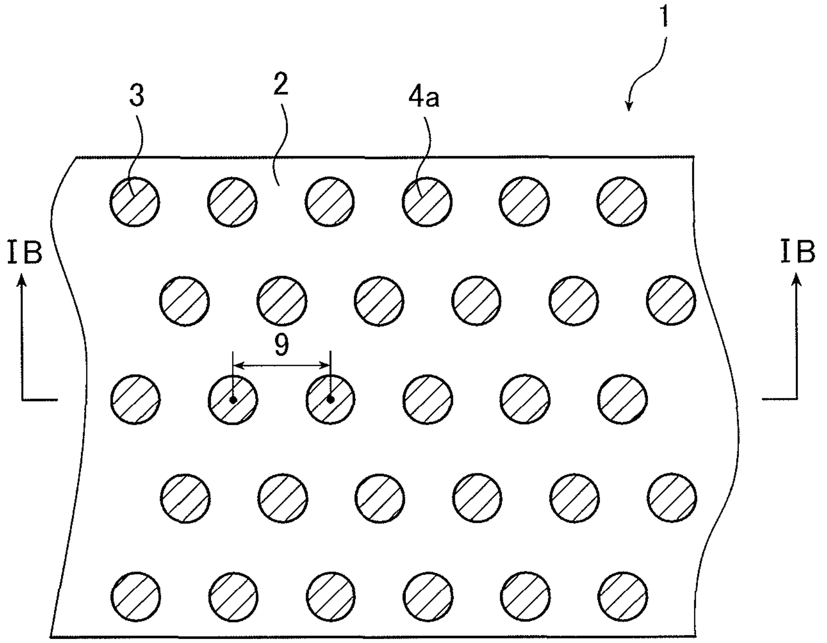
FIG. 1 shows simplified views of a preferred embodiment of an anisotropically conductive member of the invention.
Figure 1:
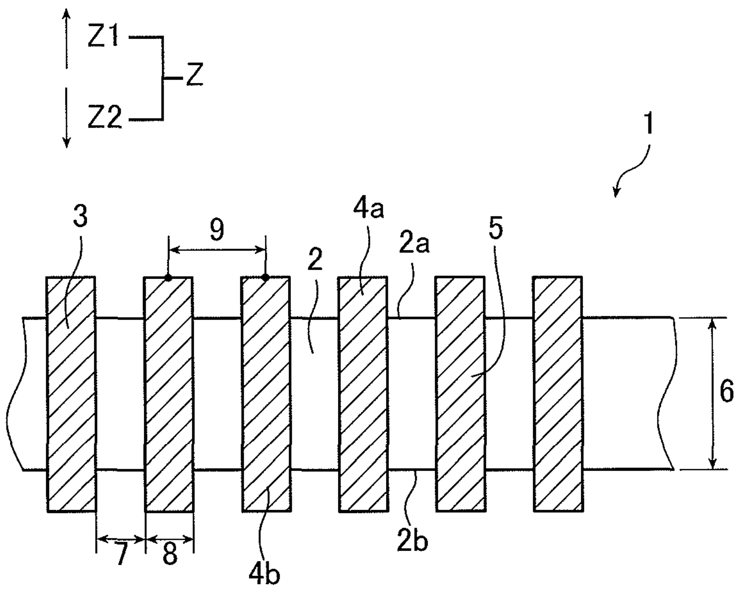

FIG. 1 shows simplified views of a preferred embodiment of an anisotropically conductive member of the invention; FIG. 1(A) being a front view and FIG. 1(B) being a cross-sectional view taken along the line IB-IB of FIG. 1(A).

An anisotropically conductive member 1 of the invention includes an insulating base 2 and a plurality of conductive paths 3 made of a conductive material.

The conductive paths 3 penetrate through the insulating base 2 in a mutually insulated state so that the length in the axial direction is equal to or larger than the length (thickness) in the thickness direction Z of the insulating base 2 and the density is at least 1,000,000 conductive paths/$mm^2$.

Each conductive path 3 is formed with one end protruded on one side of the insulating base 2 and the other end exposed or protruded on the other side thereof. However, each conductive path 3 is preferably formed with one end protruded from a surface 2*a* of the insulating base 2 and the other end protruded from a surface 2*b* of the insulating base 2 as shown in FIG. 1(B). In other words, both the ends of each conductive path 3 preferably have protrusions 4*a* and 4*b* protruded from the main surfaces 2*a* and 2*b* of the insulating base, respectively.

In addition, each conductive path 3 is preferably formed so that at least the portion within the insulating base 2 (hereinafter also referred to as "conductive portion 5 within the base") is substantially parallel (parallel in FIG. 1) to the thickness direction Z of the insulating base 2. More specifically, the ratio of the centerline length of each conductive path to the thickness of the insulating base (length/thickness) is preferably from 1.0 to 1.2 and more preferably from 1.0 to 1.05.

Next, the materials and sizes of the insulating base and the conductive paths and their forming methods are described.

[Insulating Base]

The insulating base making up the anisotropically conductive member of the invention is formed using a resin material.

The resin material is not particularly limited and specific examples thereof include thermosetting resins such as epoxy resin, phenol resin, unsaturated polyester resin, acrylic resin, polycarbodiimide resin, silicone resin and polyurethane resin;

thermoplastic resins such as phenoxy resin, polyamide resin and polyimide resin; and thermoplastic elastomers such as polyurethane thermoplastic elastomer, polyester thermoplastic elastomer and polyamide thermoplastic elastomer. These resin materials may be used singly or in combination of two or more thereof.

Of these, resins which are insoluble in solvents are preferred as will be described later in the method of producing the anisotropically conductive member of the invention. More specifically, resins such as acrylic resin and unsaturated polyester resin are preferred.

In the practice of the invention, the anisotropically conductive member resulting from the insulating base formed using such a resin material may have higher flexibility compared to the anisotropically conductive members described in Patent Literatures 4 and 5 and may also be appropriately used in flexible substrates such as flexible printed circuits (FPCs) made of resins.

In the present invention, the insulating base preferably has a thickness (as shown by reference symbol 6 in FIG. 1(B)) of from 20 to 200 μm, more preferably from 40 to 150 μm and even more preferably from 50 to 120 μm. At an insulating base thickness within the foregoing range, the insulating base can be handled with ease.

In the practice of the invention, the width between neighboring conductive paths (as shown by reference symbol 7 in FIG. 1(B)) in the insulating base is preferably at least 10 nm, more preferably from 20 to 600 nm, and even more preferably from 50 to 600 nm. At a width between neighboring conductive paths of the insulating base within the foregoing range, the insulating base functions fully as an insulating barrier.

[Conductive Path]

The conductive paths making up the anisotropically conductive member of the invention are made of a conductive material.

The conductive material is not particularly limited as long as the material used has an electric resistivity of not more than $10^3$ Ω·cm. Illustrative examples of the conductive material that may be preferably used include metals such as gold (Au), silver (Ag), copper (Cu), aluminum (Al), magnesium (Mg) and nickel (Ni); conductive polymers; and so-called organic materials such as carbon nanotubes.

Of these, in terms of electric conductivity, copper, gold, aluminum and nickel are preferred, and copper and gold are more preferred.

In terms of cost, it is more preferred to use gold for only forming the surfaces of the conductive paths exposed at or protruding from both the surfaces of the insulating base (hereinafter also referred to as "end faces").

In the practice of the invention, the conductive paths are columnar and have a diameter (as shown by reference symbol 8 in FIG. 1(B)) of preferably 20 to 500 nm, more preferably 40 to 300 nm, and even more preferably 50 to 200 nm.

At a diameter of the conductive paths within the foregoing range, when electric signals are passed through the conductive paths, sufficient responses can be obtained, thus enabling more preferable use of the anisotropically conductive member of the invention as an electrically connecting member or an inspection connector for electronic components. At a conductive path diameter within the foregoing range, the anisotropically conductive member can be effectively applied to an electronic component having a surface structure in which the surface of each of many terminals disposed at a narrow pitch is recessed from the surface of the body. Protrusions of the conductive paths from the surfaces of the insulating base (in FIG. 1(B), the portions represented by reference symbols 4*a* and 4*b*; also referred to below as "bumps") do not deform under their own weight and the columnar shape of the conductive paths can be easily kept.

In the practice of the invention, as described above, the ratio of the centerline length of each conductive path to the thickness of the insulating base (length/thickness) is preferably from 1.0 to 1.2 and more preferably from 1.0 to 1.05.

A ratio of the centerline length of each conductive path to the thickness of the insulating base within the above-defined range enables the conductive path to be regarded as having a straight-tube structure and ensures a one-to-one response when an electric Signal is passed through. Therefore, the anisotropically conductive member of the invention may be more advantageously used as an inspection connector or electrically connecting member for electronic components.

In the practice of the invention, the bumps of the conductive paths preferably have a height of 0.05 to 30 μm, more preferably 0.1 to 30 μm, and even more preferably from 0.5 to 30 μm.

At a bump height within the foregoing range, the conductive paths have a large surface area and the mechanical strength can also be maintained and therefore the protruded shape of the conductive paths can be kept until just before the joining to the electrode (pad) portion of an electronic component, and the conductive paths can also be deformed according to fine topographic features of the electrode substrate, thus improving the connectivity with the electrode portion.

In the invention, the aspect ratio which is a ratio of the bump height of the conductive path to the diameter (diameter of the conductive path) (height/diameter) is preferably at least 1, more preferably at least 2, even more preferably at least 3 and most preferably at least 5.

At a bump aspect ratio within the foregoing range, the conductive paths can be deformed by application of small force, the bumps of the conductive paths each have a large surface area, and the conductive paths can also individually keep the mechanical strength in a self-sustaining range and therefore the protruded shape of the conductive paths can be kept until just before joining to the electrode (pad) portion of the electronic component.

In the practice of the invention, the conductive paths are mutually insulated by the insulating base and their density is preferably at least 1,000,000 conductive paths/$mm^2$, preferably from 1,000,000 to 40,000,000 conductive paths/$mm^2$, more preferably from 1,500,000 to 40,000,000 conductive paths/$mm^2$, and even more preferably from 2,000,000 to 30,000,000 conductive paths/$mm^2$.

At a density of the conductive paths within the foregoing range, the anisotropically conductive member of the invention can be used as an inspection connector or an electrically connecting member for electronic components such as semiconductor devices even today when still higher levels of integration have been achieved.

In the practice of the invention, the center-to-center distance between neighboring conductive paths (the portion represented by reference symbol 9 in FIG. 1; also referred to below as "pitch") is preferably from 20 to 600 nm, more preferably from 100 to 580 nm, and even more preferably from 200 to 550 nm. At a pitch within the above-defined range, a balance is easily struck between the diameter of the conductive paths and the width between the conductive paths (insulating barrier thickness).

In the invention, the conductive paths can be formed by filling a conductive material into the through micropores in the aluminum substrate.

The conductive material filling treatment step will be described in detail in connection with the anisotropically conductive member-producing method of the invention to be referred to later.

As described above, the anisotropically conductive member of the invention preferably has an insulating base thickness of from 20 to 200 μm and a conductive path diameter of from 20 to 500 nm, because electrical continuity can be confirmed at a high density while maintaining high insulating properties.

The anisotropically conductive member-producing method of the invention (hereinafter also referred to simply as the "production method of the invention") is a method of producing the above-described anisotropically conductive member of the invention and includes at least:

(1) an anodizing treatment step in which an aluminum substrate is anodized to form an anodized film;

(2) a perforating treatment step in which micropores formed by anodization are perforated after the anodizing treatment step to obtain a microstructure;

(3) a conductive material filling step in which a conductive material is filled into through micropores in the resulting microstructure after the perforating treatment step to form the conductive paths;

(4) a conductive path-protruding step in which the conductive paths are protruded from the front surface or back surface of the microstructure after the conductive material filling step to obtain an anisotropically conductive member precursor;

(5) a resin coating step in which at least part of the front surface or the back surface of the anisotropically conductive member precursor is coated with a resin which is soluble in a solvent (hereinafter also referred to as "solvent-soluble resin" after the conductive path-protruding step;

(6) a film removal step in which the anodized film of the anisotropically conductive member precursor is removed after the resin coating step;

(7) a resin filling step in which the portion in which the anodized film was formed is filled with a resin which is insoluble in a solvent (hereinafter also referred to as "solvent-insoluble resin") after the film removal step to form the insulating base; and (8) a resin removal step in which the solvent-soluble resin is removed after the resin filling step to obtain the anisotropically conductive member.

Next, an aluminum substrate that may be used in the production method of the invention, and each treatment step carried out on the aluminum substrate are described in detail.

[Aluminum Substrate]

The aluminum substrate that may be used in the production method of the invention is not subject to any particular limitation. Illustrative examples include pure aluminum plate; alloy plates composed primarily of aluminum and containing trace amounts of other elements; substrates made of low-purity aluminum (e.g., recycled material) on which high-purity aluminum has been vapor-deposited; substrates such as silicon wafers, quartz or glass whose surface has been covered with high-purity aluminum by a process such as vapor deposition or sputtering; and resin substrates on which aluminum has been laminated.

In the practice of the invention, of the aluminum substrate, the surface to be subjected to an anodizing treatment step to be described later to form an anodized film has an aluminum purity of preferably at least 99.5 wt %, more preferably at least 99.9 wt % and even more preferably at least 99.99 wt %. At an aluminum purity within the above-defined range, the array of the micropores is well ordered.

In the invention, the surface of the aluminum substrate on which the subsequently described anodizing treatment step is to be carried out is preferably subjected beforehand to degreasing treatment and mirror-like finishing treatment.

[Heat Treatment]

Heat treatment is preferably carried out at a temperature of from 200 to 350° C. for a period of about 30 seconds to about 2 minutes. Such heat treatment improves the orderliness of the array of micropores formed by the subsequently described anodizing treatment step.

Following heat treatment, it is preferable to rapidly cool the aluminum substrate. The method of cooling is exemplified by a method involving direct immersion of the aluminum substrate in water or the like.

[Degreasing Treatment]

Degreasing treatment is carried out with a suitable substance such as an acid, alkali or organic solvent so as to dissolve and remove organic substances, including dust, grease and resins, adhering to the aluminum substrate surface, and thereby prevent defects due to organic substances from arising in each of the subsequent treatments.

Preferred degreasing methods include the following: a method in which an organic solvent such as an alcohol (e.g., methanol), ketone (e.g., methyl ethyl ketone), petroleum benzin or volatile oil is contacted with the surface of the aluminum substrate at ambient temperature (organic solvent method); a method in which a liquid containing a surfactant such as soap or a neutral detergent is contacted with the surface of the aluminum substrate at a temperature of from ambient temperature to 80° C., after which the surface is rinsed with water (surfactant method); a method in which an aqueous sulfuric acid solution having a concentration of 10 to 200 g/L is contacted with the surface of the aluminum substrate at a temperature of from ambient temperature to 70° C. for a period of 30 to 80 seconds, following which the surface is rinsed with water; a method in which an aqueous solution of sodium hydroxide having a concentration of 5 to 20 g/L is contacted with the surface of the aluminum substrate at ambient temperature for about 30 seconds while electrolysis is carried out by passing a direct current through the aluminum substrate surface as the cathode at a current density of 1 to 10 $A/dm^2$, following which the surface is contacted with an aqueous solution of nitric acid having a concentration of 100 to 500 g/L and thereby neutralized; a method in which any of various known anodizing electrolytic solutions is contacted with the surface of the aluminum substrate at ambient temperature while electrolysis is carried out by passing a direct current at a current density of 1 to 10 $A/dm^2$ through the aluminum substrate surface as the cathode or by passing an alternating current through the aluminum substrate surface as the cathode; a method in which an aqueous alkali solution having a concentration of 10 to 200 g/L is contacted with the surface of the aluminum substrate at 40 to 50° C. for 15 to 60 seconds, following which the surface is contacted with an aqueous solution of nitric acid having a concentration of 100 to 500 g/L and thereby neutralized; a method in which an emulsion prepared by mixing a surfactant, water and the like into an oil such as gas oil or kerosene is contacted with the surface of the aluminum substrate at a temperature of from ambient temperature to 50° C., following which the surface is rinsed with water (emulsion degreasing method); and a method in which a mixed solution of, for example, sodium carbonate, phosphates and surfactant is contacted with the surface of the aluminum substrate at a temperature of from ambient temperature to 50° C. for 30 to 180 seconds, following which the surface is rinsed with water (phosphate method).

Of these, the organic solvent method, surfactant method, emulsion degreasing method and phosphate method are preferred from the standpoint of removing grease from the aluminum surface while causing substantially no aluminum dissolution.

Known degreasers may be used in degreasing treatment. For example, degreasing treatment may be carried out using any of various commercially available degreasers by the prescribed method.

[Mirror-Like Finishing Treatment]

Mirror-like finishing treatment is carried out to eliminate surface topographic features of the aluminum substrate and improve the uniformity and reproducibility of particle-forming treatment using, for example, electrodeposition. Exemplary surface topographic features of the aluminum substrate include rolling streaks formed during rolling of the aluminum substrate which requires a rolling step for its manufacture.

In the practice of the invention, mirror-like finishing treatment is not subject to any particular limitation, and may be carried out using any suitable method known in the art. Examples of suitable methods include mechanical polishing, chemical polishing, and electrolytic polishing.

Illustrative examples of suitable mechanical polishing methods include polishing with various commercial abrasive cloths, and methods that combine the use of various commercial abrasives (e.g., diamond, alumina) with buffing. More specifically, a method which is carried out with an abrasive while changing over time the abrasive used from one having coarser particles to one having finer particles is appropriately illustrated. In such a case, the final abrasive used is preferably one having a grit size of 1500. In this way, a glossiness of at least 50% (in the case of rolled aluminum, at least 50% in both the rolling direction and the transverse direction) can be achieved.

Examples of chemical polishing methods include various methods mentioned in the 6th edition of Aluminum Handbook (Japan Aluminum Association, 2001), pp. 164-165.

Preferred examples include phosphoric acid/nitric acid method, Alupol I method, Alupol V method, Alcoa R5 method, $H_3PO_4$—$CH_3COOH$—Cu method and $H_3PO_4$—$HNO_3$—$CH_3COOH$ method. Of these, the phosphoric acid/nitric acid method, the $H_3PO_4$—$CH_3COOH$—Cu method and the $H_3PO_4$—$HNO_3$—$CH_3COOH$ method are especially preferred.

With chemical polishing, a glossiness of at least 70% (in the case of rolled aluminum, at least 70% in both the rolling direction and the transverse direction) can be achieved.

Examples of electrolytic polishing methods include various methods mentioned in the 6th edition of Aluminum Handbook (Japan Aluminum Association, 2001), pp. 164-165; the method described in U.S. Pat. No. 2,708,655; and the method described in Jitsumu Hyomen Gijutsu (Practice of Surface Technology), Vol. 33, No. 3, pp. 32-38 (1986).

With electrolytic polishing, a glossiness of at least 70% (in the case of rolled aluminum, at least 70% in both the rolling direction and the transverse direction) can be achieved.

These methods may be suitably combined and used. In an illustrative method that may be preferably used, mechanical polishing which is carried out by changing the abrasive over time from one having coarser particles to one having finer particles is followed by electrolytic polishing.

Mirror-like finishing treatment enables a surface having, for example, a mean surface roughness Ra of 0.1 μm or less and a glossiness of at least 50% to be obtained. The mean surface roughness Ra is preferably 0.03 μm or less and more preferably 0.02 μm or less. The glossiness is preferably at least 70%, and more preferably at least 80%.

The glossiness is the specular reflectance which can be determined in accordance with JIS Z8741-1997 (Method 3: 60° Specular Gloss) in a direction perpendicular to the rolling direction. Specifically, measurement is carried out using a variable-angle glossmeter (e.g., VG-1D, manufactured by Nippon Denshoku Industries Co., Ltd.) at an angle of incidence/reflection of 60° when the specular reflectance is 70% or less, and at an angle of incidence/reflection of 20° when the specular reflectance is more than 70%.

[Anodizing Treatment Step]

The anodizing treatment step is a step for anodizing the aluminum substrate to form a micropore-bearing anodized film at the surface of the aluminum substrate.

Conventionally known methods may be used for anodizing treatment in the production method of the invention, but a self-ordering method and a constant voltage treatment to be described below are preferably used because it is preferred to use an anisotropically conductive member obtained by perforating micropores disposed so that the degree of ordering of the conductive paths as defined by formula (I) is at least 50% and filling the through micropores with a conductive material in order to more reliably ensure the vertical conductivity in the conductive paths.

$$\text{Degree of ordering}(\%)=B/A\times 100 \qquad \text{(i)}$$

In formula (i), A represents the total number of micropores in a measurement region, and B represents the number of specific micropores in the measurement region for which, when a circle is drawn so as to be centered on the center of gravity of a specific micropore and so as to be of the smallest radius that is internally tangent to the edge of another micropore, the circle includes centers of gravity of six micropores other than the specific micropore.

Figure 2:
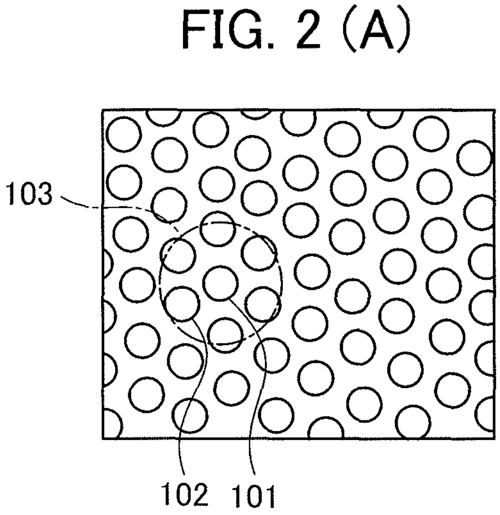
FIG. 2 illustrates a method for computing the degree of ordering of micropores.
Figure 2:
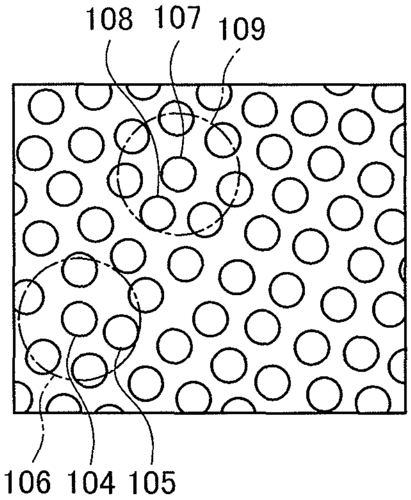

FIG. 2 illustrates a method for computing the degree of ordering of micropores. Above formula (1) is explained more fully below by reference to FIG. 2.

In the case of a first micropore 101 shown in FIG. 2(A), when a circle 103 is drawn so as to be centered on the center of gravity of the first micropore 101 and so as to be of the smallest radius that is internally tangent to the edge of another micropore (inscribed in a second micropore 102), the interior of the circle 3 includes the centers of six micropores other than the first micropore 101. Therefore, the first micropore 101 is included in B.

In the case of another first micropore 104 shown in FIG. 2(B), when a circle 106 is drawn so as to be centered on the center of gravity of the first micropore 104 and so as to be of the smallest radius that is internally tangent to the edge of another micropore (inscribed in a second micropore 105), the interior of the circle 106 includes the centers of gravity of five micropores other than the first micropore 104. Therefore, the first micropore 104 is not included in B.

In the case of yet another first micropore 107 shown in FIG. 2(B), when a circle 109 is drawn so as to be centered on the center of gravity of the first micropore 107 and so as to be of the smallest radius that is internally tangent to the edge of another micropore (inscribed in a second micropore 108), the interior of the circle 109 includes the centers of gravity of seven micropores other than the first micropore 107. Therefore, the first micropore 107 is not included in B.

The self-ordering method is a method which enhances the orderliness by using the regularly arranging nature of micropores in an anodized film and eliminating factors that may disturb an orderly arrangement. Specifically, an anodized film is formed on high-purity aluminum at a voltage appropriate for the type of electrolytic solution and at a low speed over an extended period of time (e.g., from several hours to well over ten hours).

In this method, because the micropore size (pore size) depends on the voltage, a desired pore size can be obtained to some extent by controlling the voltage.

In order to form micropores by the self-ordering method, at least the subsequently described anodizing treatment (A) should be carried out. However, micropore formation is preferably carried out by a process in which the subsequently described anodizing treatment (A), film removal treatment (B) and re-anodizing treatment (C) are carried out in this order (self-ordering method I), or a process in which the subsequently described anodizing treatment (D) and oxide film dissolution treatment (E) are carried out in this order at least once (self-ordering method II).

Next, the respective treatments in the self-ordering method I and self-ordering method II in the preferred embodiments are described in detail.

[Self-Ordering Method I]

<Anodizing Treatment (A)>

The average flow velocity of electrolytic solution in anodizing treatment (A) is preferably from 0.5 to 20.0 m/min, more preferably from 1.0 to 15.0 m/min, and even more preferably from 2.0 to 10.0 m/min. By carrying out anodizing treatment (A) at the foregoing flow velocity, a uniform and high degree of ordering can be achieved.

The method for causing the electrolytic solution to flow under the above conditions is not subject to any particular limitation. For example, a method involving the use of a common agitator such as a stirrer may be employed. The use of a stirrer in which the stirring speed can be controlled with a digital display is particularly desirable because it enables the average flow velocity to be regulated. An example of such a stirrer is the Magnetic Stirrer HS-50D (manufactured by As One Corporation).

Anodizing treatment (A) may be carried out by, for example, a method in which current is passed through the aluminum substrate as the anode in a solution having an acid concentration of from 1 to 10 wt %.

The solution used in anodizing treatment (A) is preferably an acid solution. A solution of sulfuric acid, phosphoric acid, chromic acid, oxalic acid, sulfamic acid, benzenesulfonic acid, amidosulfonic acid, glycolic acid, tartaric acid, malic acid or citric acid is more preferred. Of these, a solution of sulfuric acid, phosphoric acid, or oxalic acid is especially preferred. These acids may be used singly or in combination of two or more thereof.

The anodizing treatment (A) conditions vary depending on the electrolytic solution employed, and thus cannot be strictly specified. However, the following conditions are generally preferred: an electrolyte concentration of from 0.1 to 20 wt %, a solution temperature of from −10 to 30° C., a current density of from 0.01 to 20 A/$dm^2$, a voltage of from 3 to 300 V, and an electrolysis time of from 0.5 to 30 hours. An electrolyte concentration of from 0.5 to 15 wt %, a solution temperature of from −5 to 25° C., a current density of from 0.05 to 15 A/$dm^2$, a voltage of from 5 to 250 V, and an electrolysis time of from 1 to 25 hours are more preferred. An electrolyte concentration of from 1 to 10 wt %, a solution temperature of from 0 to 20° C., a current density of from 0.1 to 10 A/$dm^2$, a voltage of from 10 to 200 V, and an electrolysis time of from 2 to 20 hours are even more preferred.

The treatment time in anodizing treatment (A) is preferably from 0.5 minute to 16 hours, more preferably from 1 minute to 12 hours, and even more preferably from 2 minutes to 8 hours.

Aside from being carried out at a constant voltage, anodizing treatment (A) may be carried out using a method in which the voltage is intermittently or continuously varied. In such cases, it is preferable to have the voltage gradually decrease. It is possible in this way to lower the resistance of the anodized film, bringing about the formation of small micropores in the anodized film. As a result, this approach is preferable for improving uniformity, particularly when sealing is subsequently carried out by electrodeposition treatment.

In the practice of the invention, the anodized film formed by such anodizing treatment (A) preferably has a thickness of 1 to 1000 μm, more preferably 5 to 500 μm, and even more preferably 10 to 300 μm.

In the practice of the invention, the anodized film formed by such anodizing treatment (A) has an average micropore density of preferably at least 1,000,000 micropores/$mm^2$, more preferably 1,000,000 to 40,000,000 micropores/$mm^2$, even more preferably 1,500,000 to 40,000,000 micropores/$mm^2$ and most preferably 2,000,000 to 30,000,000 micropores/$mm^2$.

It is preferable for the micropores to have a surface coverage of from 3 to 50%.

The surface coverage of the micropores is defined here as the ratio of the total surface area of the micropore openings to the surface area of the aluminum surface.

<Film Removal Treatment (B)>

In film removal treatment (B), the anodized film formed at the surface of the aluminum substrate by the above-described anodizing treatment (A) is dissolved and removed.

The subsequently described perforating treatment step may be carried out immediately after forming an anodized film at the surface of the aluminum substrate by the above-described anodizing treatment (A). However, it is preferred to additionally carry out after the above-described anodizing treatment (A), film removal treatment (B) and the subsequently described re-anodizing treatment (C) in this order, followed by the subsequently described perforating treatment step.

Given that the orderliness of the anodized film increases as the aluminum substrate is approached, by using this film removal treatment (B) to remove the anodized film that has been formed, the lower portion of the anodized film remaining at the surface of the aluminum substrate emerges at the surface, affording an orderly array of pits. Therefore, in film removal treatment (B), aluminum is not dissolved; only the anodized film made of alumina (aluminum oxide) is dissolved.

The alumina dissolving solution is preferably an aqueous solution containing at least one material selected from the group consisting of chromium compounds, nitric acid, sodium hydroxide, potassium hydroxide, phosphoric acid, zirconium compounds, titanium compounds, lithium salts, cerium salts, magnesium salts, sodium hexafluorosilicate, zinc fluoride, manganese compounds, molybdenum compounds, magnesium compounds, barium compounds, and uncombined halogens.

Illustrative examples of chromium compounds include chromium (III) oxide and chromium (VI) oxide.

Examples of zirconium compounds include zirconium ammonium fluoride, zirconium fluoride and zirconium chloride.

Examples of titanium compounds include titanium oxide and titanium sulfide.

Examples of lithium salts include lithium fluoride and lithium chloride.

Examples of cerium salts include cerium fluoride and cerium chloride.

Examples of magnesium salts include magnesium sulfide.

Examples of manganese compounds include sodium permanganate and calcium permanganate.

Examples of molybdenum compounds include sodium molybdate.

Examples of magnesium compounds include magnesium fluoride pentahydrate.

Examples of barium compounds include barium oxide, barium acetate, barium carbonate, barium chlorate, barium chloride, barium fluoride, barium iodide, barium lactate, barium oxalate, barium perchlorate, barium selenate, barium selenite, barium stearate, barium sulfite, barium titanate, barium hydroxide, barium nitrate, and hydrates thereof.

Of the above barium compounds, barium oxide, barium acetate and barium carbonate are preferred. Barium oxide is especially preferred.

Examples of uncombined halogens include chlorine, fluorine and bromine.

Of the above, the alumina dissolving solution is preferably an acid-containing aqueous solution. Examples of the acid include sulfuric acid, phosphoric acid, nitric acid and hydrochloric acid. A mixture of two or more acids is also acceptable.

The acid concentration is preferably at least 0.01 mol/L, more preferably at least 0.05 mol/L, and even more preferably at least 0.1 mol/L. Although there is no particular upper limit in the acid concentration, in general, the concentration is preferably 10 mol/L or less, and more preferably 5 mol/L or less. A needlessly high concentration is uneconomical, in addition to which higher concentrations may result in dissolution of the aluminum substrate.

The alumina dissolving solution has a temperature of preferably −10° C. or higher, more preferably −5° C. or higher, and even more preferably 0° C. or higher. Carrying out treatment using a boiling alumina dissolving solution destroys or disrupts the starting points for ordering. Hence, the alumina dissolving solution is preferably used without being boiled.

The alumina dissolving solution dissolves alumina, but does not dissolve aluminum. Here, the alumina dissolving solution may dissolve a very small amount of aluminum, so long as it does not dissolve a substantial amount of aluminum.

Film removal treatment (B) is carried out by bringing an aluminum substrate at which an anodized film has been formed into contact with the above-described alumina dissolving solution. Examples of the contacting method include, but are not limited to, immersion and spraying. Of these, immersion is preferred.

Immersion is a treatment in which the aluminum substrate at which an anodized film has been formed is immersed in the alumina dissolving solution. To achieve uniform treatment, it is desirable to carry out stirring at the time of immersion treatment.

The immersion treatment time is preferably at least 10 minutes, more preferably at least 1 hour, even more preferably at least 3 hours, and most preferably at least 5 hours.

<Re-Anodizing Treatment (C)>

An anodized film having micropores with an even higher degree of ordering can be formed by carrying out anodizing treatment once again after the anodized film is removed by the above-described film removal treatment (B) to form well-ordered pits at the surface of the aluminum substrate.

Re-anodizing treatment (C) may be carried out using a method known in the art, although it is preferably carried out under the same conditions as the above-described anodizing treatment (A).

Alternatively, suitable use may be made of a method in which the current is repeatedly turned on and off while keeping the dc voltage constant, or a method in which the current is repeatedly turned on and off while intermittently varying the dc voltage. Because these methods result in the formation of small micropores in the anodized film, they are preferable for improving uniformity, particularly when sealing is to be carried out by electrodeposition treatment.

When re-anodizing treatment (C) is carried out at a low temperature, the array of micropores is well-ordered and the pore size is uniform.

On the other hand, by carrying out re-anodizing treatment (C) at a relatively high temperature, the micropore array may be disrupted or the variance in pore size may be set within a given range. The variance in pore size may also be controlled by the treatment time.

In the practice of the invention, the anodized film formed by such reanodizing treatment (C) preferably has a thickness of from 20 to 200 μm, more preferably from 40 to 150 μm, and even more preferably from 50 to 120 μm.

In the practice of the invention, the anodized film formed by such anodizing treatment (C) has an average micropore density of preferably at least 1,000,000 micropores/$mm^2$, more preferably 1,000,000 to 40,000,000 micropores/$mm^2$, even more preferably 1,500,000 to 40,000,000 micropores/$mm^2$ and most preferably 2,000,000 to 30,000,000 micropores/$mm^2$.

It is preferable for the micropores to have a surface coverage of from 3 to 50%.

In addition, in the invention, the anodized film formed by such anodizing treatment (C) has micropores with a pore size of preferably 20 to 500 nm, more preferably 40 to 300 nm, and even more preferably 50 to 200 nm.

In the self-ordering method I, in place of the above-described anodizing treatment (A) and film removal treatment (B), use may be made of, for example, a physical process, a particle beam process, a block copolymer process or a resist patterning/exposure/etching process to form pits as starting points for micropore formation by the above-described re-anodizing treatment (C).

<Physical Process>

Physical processes are exemplified by processes which use imprinting (transfer processes and press patterning processes in which a plate or roll having projections thereon is pressed against the aluminum substrate to form pits at the substrate). A specific example is a process in which a plate having numerous projections on a surface thereof is pressed against the aluminum surface, thereby forming pits. For example, the process described in JP 10-121292 A may be used.

Another example is a process in which polystyrene spheres are densely arranged on the aluminum surface, $SiO_2$ is vapor-deposited onto the spheres, then the polystyrene spheres are removed and the substrate is etched using the vapor-deposited $SiO_2$ as the mask, thereby forming pits.

<Particle Beam Process>

In a particle beam process, pits are formed by irradiating the aluminum surface with a particle beam. This process has the advantage that the positions of the pits can be controlled as desired.

Examples of the particle beam include a charged particle beam, a focused ion beam (FIB), and an electron beam.

For example, the process described in JP 2001-105400 A may be used as the particle beam process.

<Block Copolymer Process>

The block copolymer process involves forming a block copolymer layer on the aluminum surface, forming an islands-in-the-sea structure in the block copolymer layer by thermal annealing, then removing the island components to form pits.

An example of the block copolymer process that may be used is the process described in JP 2003-129288 A.

<Resist Patterning/Exposure/Etching Process>

In a resist patterning/exposure/etching process, resist on the surface of an aluminum plate is exposed and developed by photolithography or electron beam lithography to form a resist pattern. The resist is then etched, forming pits which pass entirely through the resist to the aluminum surface.

[Self-Ordering Method II]

<First Step: Anodizing Treatment (D)>

Conventionally known electrolytic solutions may be used in anodizing treatment (D) but the orderliness of the pore array can be considerably improved by carrying out, under conditions of direct current and constant voltage, anodization using an electrolytic solution in which the parameter R represented by general formula (II) wherein A is the film-forming rate during application of current and B is the film dissolution rate during non-application of current satisfies 160≤R≤200, preferably 170≤R≤190 and most particularly 175≤R≤185.

$$R=A[\text{nm/s}]/(B[\text{nm/s}]\times\text{voltage applied}[\text{V}]) \quad \text{(ii)}$$

As in the above-described anodizing treatment (A), the average flow velocity of electrolytic solution in anodizing treatment (D) is preferably from 0.5 to 20.0 m/min, more preferably from 1.0 to 15.0 m/min, and even more preferably from 2.0 to 10.0 m/min. By carrying out anodizing treatment (D) at the flow velocity within the above-defined range, a uniform and high degree of ordering can be achieved.

As in the above-described anodizing treatment (A), the method for causing the electrolytic solution to flow under the above conditions is not subject to any particular limitation. For example, a method involving the use of a common agitator such as a stirrer may be employed. The use of a stirrer in which the stirring speed can be controlled with a digital display is particularly desirable because it enables the average flow velocity to be regulated. An example of such a stirrer is the Magnetic Stirrer HS-50D (manufactured by As One Corporation).

The anodizing treatment solution preferably has a viscosity at 25° C. and 1 atm of 0.0001 to 100.0 Pa·s and more preferably 0.0005 to 80.0 Pa·s. By carrying out anodizing treatment (D) using the electrolytic solution having the viscosity within the above-defined range, a uniform and high degree of ordering can be achieved.

The electrolytic solution used in anodizing treatment (D) may be an acidic solution or an alkaline solution, but an acidic electrolytic solution is advantageously used in terms of improving the circularity of the pores.

More specifically, as in the above-described anodizing treatment (A), a solution of hydrochloric acid, sulfuric acid, phosphoric acid, chromic acid, oxalic acid, glycolic acid, tartaric acid, malic acid, citric acid, sulfamic acid, benzenesulfonic acid, amidosulfonic acid, glycolic acid, tartaric acid, malic acid, or citric acid is more preferred. Of these, a solution of sulfuric acid, phosphoric acid or oxalic acid is especially preferred. These acids may be used singly or in combination of two or more thereof by adjusting as desired the parameter in the calculating formula represented by general formula (II).

The anodizing treatment (D) conditions vary depending on the electrolytic solution employed, and thus cannot be strictly specified. However, as in the above-described anodizing treatment (A), the following conditions are generally preferred: an electrolyte concentration of from 0.1 to 20 wt %, a solution temperature of from −10 to 30° C., a current density of from 0.01 to 20 A/dm$^2$, a voltage of from 3 to 500 V, and an electrolysis time of from 0.5 to 30 hours. An electrolyte concentration of from 0.5 to 15 wt %, a solution temperature of from −5 to 25° C., a current density of from 0.05 to 15 A/dm$^2$, a voltage of from 5 to 250 V, and an electrolysis time of from 1 to 25 hours are more preferred. An electrolyte concentration of from 1 to 10 wt %, a solution temperature of from 0 to 20° C., a current density of from 0.1 to 10 A/dm$^2$, a voltage of from 10 to 200 V, and an electrolysis time of from 2 to 20 hours are even more preferred.

In the invention, the anodized film formed by such anodizing treatment (D) has a thickness of preferably from 0.1 to 300 μm, more preferably from 0.5 to 150 μm and even more preferably from 1 to 100 μm.

In the practice of the invention, the anodized film formed by such anodizing treatment (D) has an average micropore density of preferably at least 1,000,000 micropores/mm$^2$, more preferably 1,000,000 to 40,000,000 micropores/mm$^2$, even more preferably 1,500,000 to 40,000,000 micropores/mm$^2$ and most preferably 2,000,000 to 30,000,000 micropores/mm$^2$.

It is preferable for the micropores to have a surface coverage of from 3 to 50%.

Figure 3:
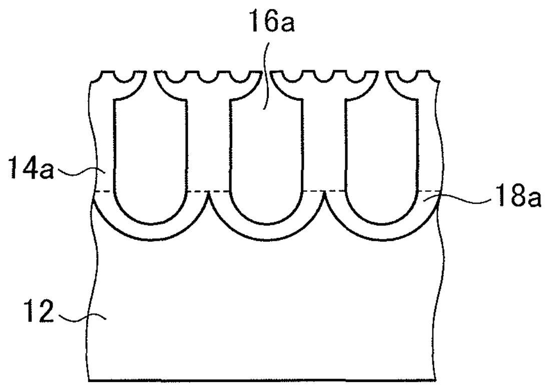
FIG. 3 shows schematic cross-sectional views for illustrating an anodizing treatment step in the manufacturing method of the invention.
Figure 3:
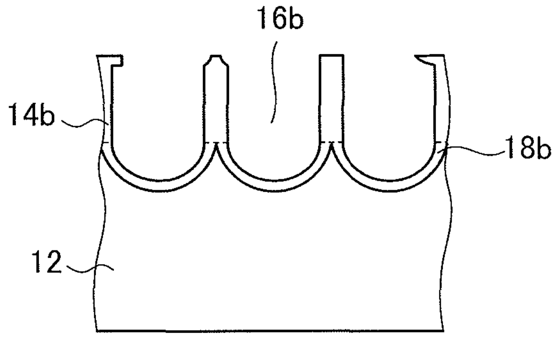
Figure 3:
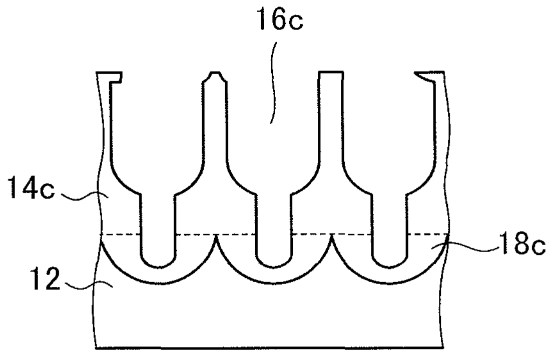
Figure 3:
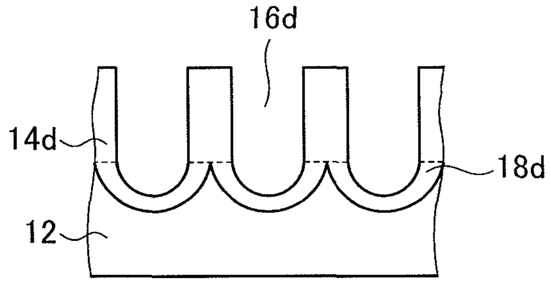

As shown in FIG. 3(A), as a result of anodizing treatment (D), an anodized film 14*a* bearing micropores 16*a* is formed at a surface of an aluminum substrate 12. A barrier layer 18*a* is present on the side of the anodized film 14*a* closer to the aluminum substrate 12.

<Second Step: Oxide Film Dissolution Treatment (E)>

Oxide film dissolution treatment (E) is a treatment for enlarging the diameter of the micropores present in the anodized film formed by the above-described anodizing treatment (D) (pore size enlarging treatment).

Oxide film dissolution treatment (E) is carried out by bringing the aluminum substrate having undergone the above-described anodizing treatment (D) into contact with an aqueous acid or alkali solution. Examples of the contacting method include, but are not limited to, immersion and spraying. Of these, immersion is preferred.

When oxide film dissolution treatment (E) is to be carried out with an aqueous acid solution, it is preferable to use an aqueous solution of an inorganic acid such as sulfuric acid, phosphoric acid, nitric acid or hydrochloric acid, or a mixture thereof. It is particularly preferable to use an aqueous solution containing no chromic acid in terms of its high degree of safety. The aqueous acid solution preferably has a concentration of 1 to 10 wt %. The aqueous acid solution preferably has a temperature of 25 to 60° C.

When oxide film dissolution treatment (E) is to be carried out with an aqueous alkali solution, it is preferable to use an aqueous solution of at least one alkali selected from the group consisting of sodium hydroxide, potassium hydroxide and lithium hydroxide. The aqueous alkali solution preferably has a concentration of 0.1 to 5 wt %. The aqueous alkali solution preferably has a temperature of 20 to 35° C.

Specific examples of solutions that may be preferably used include a 40° C. aqueous solution containing 50 g/L of phosphoric acid, a 30° C. aqueous solution containing 0.5 g/L of sodium hydroxide, and a 30° C. aqueous solution containing 0.5 g/L of potassium hydroxide.

The time of immersion in the aqueous acid solution or aqueous alkali solution is preferably from 8 to 120 minutes, more preferably from 10 to 90 minutes and even more preferably from 15 to 60 minutes.

In oxide film dissolution treatment (E), the degree of enlargement of the pore size varies with the conditions of anodizing treatment (D) but the ratio of the pore size after the treatment to that before the treatment is preferably 1.05 to 100, more preferably 1.1 to 75 and even more preferably 1.2 to 50.

Oxide film dissolution treatment (B) dissolves the surface of the anodized film 14*a* and the interiors of the micropores 16*a* (barrier layer 18*a* and the porous layer) as shown in FIG. 3(A) to obtain an aluminum member having a micropore 16*b*-bearing anodized film 14*b* on the aluminum substrate 12 as shown in FIG. 3(B). As in FIG. 3(A), a barrier layer 18*b* is present on the side of the anodized film 14*b* closer to the aluminum substrate 12.

<Third Step: Anodizing Treatment (D)>

In the self-ordering method II, it is preferred to carry out the above-described anodizing treatment (D) again after the above-described oxide film dissolution treatment (E).

By carrying out anodizing treatment (D) again, oxidation reaction of the aluminum substrate 12 shown in FIG. 3(B) proceeds to obtain, as shown in FIG. 3(C), an aluminum member which has an anodized film 14*c* formed on the aluminum substrate 12, the anodized film 14*c* bearing micropores 16*c* having a larger depth than the micropores 16*b*. As in FIG. 3(A), a barrier layer 18*c* is present on the side of the anodized film 14*c* closer to the aluminum substrate 12.

<Fourth Step: Oxide Film Dissolution Treatment (E)>

In the self-ordering method II, it is preferred to further carry out the above-described oxide film dissolution treatment (E) after the above-described anodizing treatment (D), oxide film dissolution treatment (E) and anodizing treatment (D) have been carried out in this order.

This treatment enables the treatment solution to enter the micropores to dissolve all the anodized film formed by anodizing treatment (D) in the third step, whereby the micropores formed by anodizing treatment (D) in the third step may have enlarged diameters.

More specifically, oxide film dissolution treatment (E) carried out again dissolves the interiors of the micropores 16*c* on the surface side from inflection points in the anodized film 14*c* shown in FIG. 3(C) to obtain an aluminum member having an anodized film 14*d* bearing straight tube-shaped micropores 16*d* on the aluminum substrate 12 as shown in FIG. 3(D). As in FIG. 3(A), a barrier layer 18*d* is present on the side of the anodized film 14*d* closer to the aluminum substrate 12.

The degree of enlargement of the pore size varies with the conditions of anodizing treatment (D) carried out in the third step but the ratio of the pore size after the treatment to that before the treatment is preferably 1.05 to 100, more preferably 1.1 to 75 and even more preferably 1.2 to 50.

The self-ordering method II involves at least one cycle of the above-described anodizing treatment (D) and oxide film dissolution treatment (E). The larger the number of repetitions is, the higher the degree of ordering of the pore array is.

The circularity of the micropores seen from the film surface side is dramatically improved by dissolving in oxide film dissolution treatment (E) all the anodized film formed by the preceding anodizing treatment (D). Therefore, this cycle is preferably repeated at least twice, more preferably at least three times and even more preferably at least four times.

In cases where this cycle is repeated at least twice, the conditions in each cycle of oxide film dissolution treatment and anodizing treatment may be the same or different. Alternatively, the treatment may be terminated by anodizing treatment.

In the practice of the invention, the anodized film formed by such self-ordering method II preferably has a thickness of from 20 to 200 μm, more preferably from 40 to 150 μm, and even more preferably from 50 to 120 μm.

In the practice of the invention, the anodized film formed by such self-ordering method II has an average micropore density of preferably at least 1,000,000 micropores/$mm^2$, more preferably 1,000,000 to 40,000,000 micropores/$mm^2$, even more preferably 1,500,000 to 40,000,000 micropores/$mm^2$ and most preferably 2,000,000 to 30,000,000 micropores/$mm^2$.

It is preferable for the micropores to have a surface coverage of from 3 to 50%.

In addition, in the invention, the anodized film formed by such self-ordering method II has micropores with a pore size of preferably 20 to 500 nm, more preferably 40 to 300 nm, and even more preferably 50 to 200 nm.

[Constant Voltage Treatment]

In a constant voltage treatment, an anodized film is formed at a low speed over an extended period of time (e.g., from several hours to well over ten hours). The pore size depends on the voltage in this treatment method and it is therefore essential to control the voltage at a constant level in terms of preventing the micropores from being branched.

The average flow velocity of electrolytic solution in anodizing treatment is preferably from 0.5 to 20.0 m/min, more preferably from 1.0 to 15.0 m/min, and even more preferably from 2.0 to 10.0 m/min. By carrying out anodizing treatment at the flow velocity within the above-defined range, a uniform and high degree of ordering can be achieved.

The method for causing the electrolytic solution to flow under the above conditions is not subject to any particular limitation. For example, a method involving the use of a common agitator such as a stirrer may be employed. The use of a stirrer in which the stirring speed can be controlled with a digital display is particularly desirable because it enables the average flow velocity to be regulated. An example of such a stirrer is the Magnetic Stirrer HS-50D (manufactured by As One Corporation).

Anodizing treatment may be carried out by, for example, a method in which current is passed through the aluminum substrate as the anode in a solution having an acid concentration of from 1 to 10 wt %.

The solution used in anodizing treatment is preferably an acid solution. A solution of sulfuric acid, phosphoric acid, chromic acid, oxalic acid, sulfamic acid, benzenesulfonic acid, amidosulfonic acid, glycolic acid, tartaric acid, malic acid or citric acid is more preferred. Of these, a solution of sulfuric acid, phosphoric acid, or oxalic acid is especially preferred. These acids may be used singly or in combination of two or more thereof.

The anodizing treatment conditions vary depending on the electrolytic solution employed, and thus cannot be strictly specified. However, the following conditions are generally preferred: an electrolyte concentration of from 0.1 to 20 wt %, a solution temperature of from −10 to 30° C., a current density of from 0.01 to 20 A/$dm^2$, a voltage of from 3 to 300 V, and an electrolysis time of from 0.5 to 50 hours. An electrolyte concentration of from 0.5 to 15 wt %, a solution temperature of from −5 to 25° C., a current density of from 0.05 to 15 A/$dm^2$, a voltage of from 5 to 250 V, and an electrolysis time of from 1 to 25 hours are more preferred. An electrolyte concentration of from 1 to 10 wt %, a solution temperature of from 0 to 20° C., a current density of from 0.1 to 10 A/$dm^2$, a voltage of from 10 to 200 V, and an electrolysis time of from 2 to 20 hours are even more preferred.

The treatment time in anodizing treatment is preferably from 0.5 minute to 16 hours, more preferably from 1 minute to 12 hours, and even more preferably from 2 minutes to 8 hours.

In the invention, the anodized film formed by such constant voltage treatment preferably has a thickness of from 20 to 200 μm, more preferably from 40 to 150 μm, and even more preferably from 50 to 120 μm.

In the practice of the invention, the anodized film formed by such constant voltage treatment has an average micropore density of preferably at least 1,000,000 micropores/$mm^2$, more preferably 1,000,000 to 40,000,000 micropores/$mm^2$, even more preferably 1,500,000 to 40,000,000 micropores/$mm^2$ and most preferably 2,000,000 to 30,000,000 micropores/$mm^2$.

It is preferable for the micropores to have a surface coverage of from 3 to 50%.

In addition, in the practice of the invention, the anodized film formed by such constant voltage treatment has micropores with a pore size of preferably 20 to 500 nm, more preferably 40 to 300 nm, and even more preferably 50 to 200 nm.

[Perforating Treatment Step]

The perforating treatment step is a step in which micropores formed by anodization are perforated after the above-described anodizing treatment step to obtain the microstructure.

In the perforating treatment step, the treatment (a) or (b) is preferably carried out.

(a) Treatment (chemical dissolution treatment) in which an acid or an alkali is used to dissolve the aluminum substrate having the anodized film formed thereon to make the micropores extend through the anodized film.

(b) Treatment (mechanical polishing treatment) in which the aluminum substrate having the anodized film formed thereon is mechanically polished to make the micropores extend through the anodized film.

The respective treatments (a) and (b) are described below in detail.

[(a) Chemical Dissolution Treatment]

More specifically, chemical dissolution treatment which follows the anodizing treatment step involves, for example, dissolving the aluminum substrate (portion represented by reference symbol 12 in FIG. 3(D)) and further removing the bottom of the anodized film (portion represented by reference symbol 18*d* in FIG. 3(D)) to make the micropores extend through the anodized film.

(Dissolution of Aluminum Substrate)

A treatment solution which does not readily dissolve the anodized film (alumina) but readily dissolves aluminum is used for dissolution of the aluminum substrate after the anodizing treatment step.

That is, use is made of a treatment solution which has an aluminum dissolution rate of at least 1 μm/min, preferably at least 3 μm/min, and more preferably at least 5 μm/min, and has an anodized film dissolution rate of 0.1 nm/min or less, preferably 0.05 nm/min or less, and more preferably 0.01 nm/min or less.

Specifically, a treatment solution which includes at least one metal compound having a lower ionization tendency than aluminum, and which has a pH of 4 or less or 8 or more, preferably 3 or less or 9 or more, and more preferably 2 or less or 10 or more is used for immersion treatment.

Preferred examples of such treatment solutions include solutions which are composed of, as the base, an aqueous solution of an acid or an alkali and which have blended therein a compound of, for example, manganese, zinc, chromium, iron, cadmium, cobalt, nickel, tin, lead, antimony, bismuth, copper, mercury, silver, palladium, platinum or gold (e.g., chloroplatinic acid), or a fluoride or chloride of any of these metals.

Of the above, it is preferable for the treatment solution to be based on an aqueous solution of an acid and to have blended therein a chloride compound.

Treatment solutions of an aqueous solution of hydrochloric acid in which mercury chloride has been blended (hydrochloric acid/mercury chloride), and treatment solutions of an aqueous solution of hydrochloric acid in which copper chloride has been blended (hydrochloric acid/copper chloride) are especially preferred from the standpoint of the treatment latitude.

There is no particular limitation on the composition of such treatment solutions. Illustrative examples of the treatment solutions that may be used include a bromine/methanol mixture, a bromine/ethanol mixture, and aqua regia.

Such a treatment solution preferably has an acid or alkali concentration of 0.01 to 10 mol/L and more preferably 0.05 to 5 mol/L.

In addition, such a treatment solution is used at a treatment temperature of preferably −10° C. to 80° C. and more preferably 0 to 60° C.

In the invention, dissolution of the aluminum substrate is carried out by bringing the aluminum substrate having undergone the anodizing treatment step into contact with the above-described treatment solution. Examples of the contacting method include, but are not limited to, immersion and spraying. Of these, immersion is preferred. The period of contact in this process is preferably from 10 seconds to 5 hours, and more preferably from 1 minute to 3 hours.

(Removal of Bottom of Anodized Film)

The bottom of the anodized film after the dissolution of the aluminum substrate is removed by immersion in an aqueous acid or alkali solution. Removal of the bottom of the anodized film causes the micropores to extend therethrough.

The bottom of the anodized film is preferably removed by the method that involves previously immersing the anodized film in a pH buffer solution to fill the micropores with the pH buffer solution from the micropore opening side, and bringing the surface opposite from the openings (i.e., the bottom of the anodized film) into contact with an aqueous acid solution or aqueous alkali solution.

When this treatment is to be carried out with an aqueous acid solution, it is preferable to use an aqueous solution of an inorganic acid such as sulfuric acid, phosphoric acid, nitric acid or hydrochloric acid, or a mixture thereof. The aqueous acid solution preferably has a concentration of 1 to 10 wt %. The aqueous acid solution preferably has a temperature of 25 to 40° C.

When this treatment is to be carried out with an aqueous alkali solution, it is preferable to use an aqueous solution of at least one alkali selected from the group consisting of sodium hydroxide, potassium hydroxide and lithium hydroxide. The aqueous alkali solution preferably has a concentration of 0.1 to 5 wt %. The aqueous alkali solution preferably has a temperature of 20 to 35° C.

Specific examples of solutions that may be preferably used include a 40° C. aqueous solution containing 50 g/L of phosphoric acid, a 30° C. aqueous solution containing 0.5 g/L of sodium hydroxide, and a 30° C. aqueous solution containing 0.5 g/L of potassium hydroxide.

The time of immersion in the aqueous acid solution or aqueous alkali solution is preferably from 8 to 120 minutes, more preferably from 10 to 90 minutes and even more preferably from 15 to 60 minutes.

In cases where the film is previously immersed in a pH buffer solution, a buffer solution suitable to the foregoing acids/alkalis is used.

[(b) Mechanical Polishing Treatment]

More specifically, mechanical polishing treatment which follows the anodizing treatment step involves, for example, mechanically polishing and removing the aluminum substrate (portion represented by reference symbol 12 in FIG. 3(D)) and the anodized film in the vicinity of the aluminum substrate (portion represented by reference symbol 18*d* in FIG. 3(D)) to make the micropores extend through the anodized film.

A wide variety of known mechanical polishing treatment methods may be used for mechanical polishing treatment and, for example, mechanical polishing illustrated for mirror-like finishing treatment may be used. However, chemical mechanical polishing (CMP) is preferably carried out owing to its high fine polishing rate. CMP treatment may be carried out using a CMP slurry such as PNANERLITE-7000 available from Fujimi Inc., GPX HSC800 available from Hitachi Chemical Co., Ltd., or CL-1000 available from AGC Seimi Chemical Co., Ltd.

Figure 4:
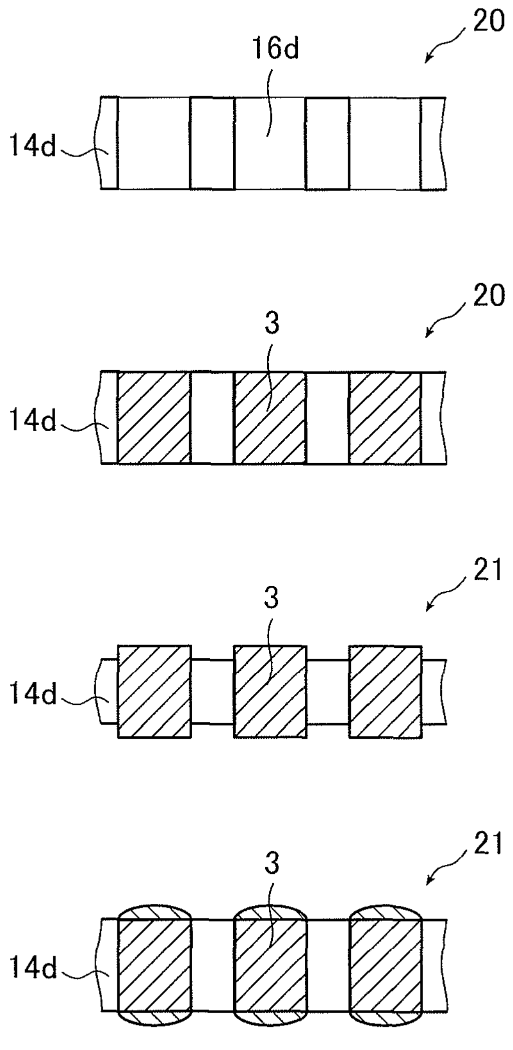
FIG. 4 shows schematic end views for illustrating a conductive material filling step and other steps in the manufacturing method of the invention.

This perforating treatment step yields a structure shown in FIG. 3(D) after removal of the aluminum substrate 12 and the barrier layer 18*d*, that is, a microstructure 20 as shown in FIG. 4(A).

[Protective Film-Forming Treatment Step]

In the production method of the invention, the micropore size changes with time by the hydration of the anodized film made of alumina with moisture in the air and therefore protective film-forming treatment is preferably carried out before the conductive material filling step to be described later.

Illustrative examples of protective films include inorganic protective films containing elemental zirconium and/or elemental silicon, and organic protective films containing a water-insoluble polymer.

The method of forming an elemental zirconium-containing protective film is not subject to any particular limitation, although a commonly used method of treatment involves direct immersion in an aqueous solution in which a zirconium compound is dissolved. From the standpoint of the strength and stability of the protective film, the use of an aqueous solution in which a phosphorus compound has also been dissolved is preferred.

Illustrative examples of the zirconium compound that may be used include zirconium, zirconium fluoride, sodium hexafluorozirconate, calcium hexafluorozirconate, zirconium fluoride, zirconium chloride, zirconium oxychloride, zirconium oxynitrate, zirconium sulfate, zirconium ethoxide, zirconium propoxide, zirconium butoxide, zirconium acetylacetonate, tetrachlorobis(tetrahydrofuran)zirconium, bis(methylcyclopentadienyl)zirconium dichloride, dicyclopentadienylzirconium dichloride and ethylenebis(indenyl)zirconium (IV) dichloride. Of these, sodium hexafluorozirconate is preferred.

From the standpoint of the uniformity of the protective film thickness, the concentration of the zirconium compound in the aqueous solution is preferably from 0.01 to 10 wt %, and more preferably from 0.05 to 5 wt %.

Illustrative examples of the phosphorus compound that may be used include phosphoric acid, sodium phosphate, calcium phosphate, sodium hydrogen phosphate and calcium hydrogen phosphate. Of these, sodium hydrogen phosphate is preferred.

From the standpoint of the uniformity of the protective film thickness, the concentration of the zirconium compound in the aqueous solution is preferably from 0.1 to 20 wt %, and more preferably from 0.5 to 10 wt %.

The treatment temperature is preferably from 0 to 120° C., and more preferably from 20 to 100° C.

The method of forming a protective film containing elemental silicon is not subject to any particular limitation, although a commonly used method of treatment involves direct immersion in an aqueous solution in which an alkali metal silicate is dissolved.

The thickness of the protective film can be adjusted by varying the ratio between the silicate ingredients silicon dioxide $SiO_2$ and alkali metal oxide $M_2O$ (generally represented as the molar ratio $[SiO_2]/[M_2O]$) and the concentrations thereof in the aqueous solution of an alkali metal silicate.

It is especially preferable here to use sodium or potassium as M.

The molar ratio $[SiO_2]/[M_2O]$ is preferably from 0.1 to 5.0, and more preferably from 0.5 to 3.0.

The $SiO_2$ content is preferably from 0.1 to 20 wt %, and more preferably from 0.5 to 10 wt %.

The organic protective film is preferably obtained by a method which involves direct immersion in an organic solvent in which a water-insoluble polymer is dissolved, followed by heating treatment to evaporate off only the solvent.

Illustrative examples of the water-insoluble polymer include polyvinylidene chloride, poly(meth)acrylonitrile, polysulfone, polyvinyl chloride, polyethylene, polycarbonate, polystyrene, polyamide and cellophane.

Illustrative examples of the organic solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene.

The concentration is preferably from 0.1 to 50 wt %, and more preferably from 1 to 30 wt %.

The heating temperature during solvent volatilization is preferably from 30 to 300° C., and more preferably from 50 to 200° C.

Following protective film-forming treatment, the anodized film including the protective film has a thickness of preferably from 20 to 200 μm, more preferably from 40 to 150 μm and even more preferably from 50 to 120 μm.

[Conductive Material Filling Step]

The conductive material filling step is a step in which a conductive material is filled into the through micropores in the resulting microstructure after the perforating treatment step to form the conductive paths.

In the conductive material filling step, one of the following treatments (a) to (c) is preferably carried out.

(a) Treatment (immersion treatment) in which the microstructure having the through micropores is immersed in a solution containing a conductive material to fill the conductive material into the through micropores.

(b) Treatment (electrolytic plating treatment) in which the conductive material is filled into the through micropores by electrolytic plating.

(c) Treatment (vapor deposition treatment) in which the conductive material is filled into the through micropores by vapor deposition.

The conductive material to be filled makes up the conductive paths of an anisotropically conductive member as described in connection with the anisotropically conductive member of the invention.

The respective treatments (a) to (c) are described below in detail.

[(a) Immersion Treatment]

Known methods such as electroless plating treatment, high viscosity molten metal immersion treatment and conductive polymer solution immersion treatment may be used for the treatment in which the microstructure having the through micropores is immersed in a solution containing a conductive material to fill the conductive material into the through micropores.

Of these, metals are preferred conductive materials and therefore electroless plating treatment and molten metal immersion treatment are preferred and electroless plating treatment is preferred in terms of ease of handling.

In electroless plating, known methods and treatment solutions may be used without particular limitation. It is particularly preferred to use a method in which nuclei of a metal to be deposited are provided in advance, a compound which may dissolve in a solvent containing the metal and a reducing agent are dissolved in a solution and the insulating base is immersed in the solution to fill the through micropores with the metal.

This treatment may be performed in combination with electrolytic plating to be described below.

[(b) Electrolytic Plating Treatment]

In the production method of the invention, when the through micropores are filled with the conductive material by electrolytic plating, it is necessary to provide rest periods during pulse electrolysis or constant potential electrolysis. The rest periods must be at least 10 seconds, and are preferably from 30 to 60 seconds.

To promote stirring of the electrolytic solution, it is desirable to apply ultrasound energy.

Moreover, the electrolysis voltage is generally not more than 20 V, and preferably not more than 10 V, although it is preferable to first measure the deposition potential of the target metal in the electrolytic solution to be used and carry out constant potential electrolysis at that potential + not more than 1V. When carrying out constant potential electrolysis, it is desirable to use also cyclic voltammetry. To this end, use may be made of potentiostats such as those available from Solartron, BAS Inc., Hokuto Denko Corporation and Ivium Technologies.

A conventionally known plating solution may be used.

More specifically, when copper is to be deposited, an aqueous solution of copper sulfate may generally be used. The concentration of copper sulfate is preferably from 1 to 300 g/L, and more preferably from 100 to 200 g/L. Deposition can be promoted by adding hydrochloric acid to the electrolytic solution. In such a case, the concentration of hydrochloric acid is preferably from 10 to 20 g/L.

When gold is to be deposited, it is desirable to carry out plating by alternating current electrolysis using a sulfuric acid solution of a tetrachloroaurate.

[(c) Vapor Deposition Treatment]

In cases where the conductive material is filled into the through micropores by vapor deposition, known vapor deposition processes such as physical vapor deposition (PVD) and chemical vapor deposition (CVD) may be used. The conditions of vapor deposition treatment vary with the object to be treated but a temperature of −40° C. to 80° C. and a degree of vacuum of not more than $10^{-3}$ Pa are preferred in terms of the vapor deposition rate and a temperature of −20° C. to 60° C. and a degree of vacuum of not more than $10^{-4}$ Pa are more preferred.

For the purpose of uniform filling, a method may also be advantageously used in which the surface of the insulating substrate is appropriately inclined with respect to the direction of vapor deposition to carry about vapor deposition from an oblique direction.

This conductive material filling step yields a microstructure 20 shown in FIG. 4(B).

[Surface Planarization Step]

In the production method of the invention, the conductive material filling step is preferably followed by the surface planarization step for planarizing the front surface and the back surface of the microstructure.

By carrying out the surface planarization step, the front surface and the back surface of the microstructure after the conductive material has been filled can be planarized while removing excess conductive material adhering to the front and back surfaces.

In the surface planarization step, one of the following treatments (a) to (c) is preferably carried out:

(a) Treatment by chemical mechanical polishing (CMP);

(b) Electrolytic polishing treatment; and (c) Ion milling treatment.

The respective treatments (a) to (c) are described below in detail.

[(a) Treatment by Chemical Mechanical Polishing (CMP)]

CMP treatment may be carried out using a CMP slurry such as PNANERLITE-7000 available from Fujimi Inc., GPX HSC800 available from Hitachi Chemical Co., Ltd., or CL-1000 available from AGC Seimi Chemical Co., Ltd.

It is not preferred to use a slurry for interlayer dielectric films and barrier metals, because the anodized film should not be polished.

[(b) Electrolytic Polishing Treatment]

Examples of electrolytic polishing methods include various methods mentioned in the 6th edition of Aluminum Handbook (Japan Aluminum Association, 2001), pp. 164-165; the method described in U.S. Pat. No. 2,708,655; and the method described in Jitsumu Hyomen Gijutsu (Practice of Surface Technology), Vol. 33, No. 3, pp. 32-38 (1986).

[(c) Ion Milling Treatment]

Ion milling treatment is carried out when more precise polishing than the above-described CMP treatment and electrolytic polishing treatment is necessary and any known techniqde may be used. Argon ion which is one of general ion species is preferably used.

[Conductive Path-Protruding Step]

The conductive path-protruding step is a step in which the conductive paths are protruded from the front surface and/or back surface of the microstructure after the conductive material filling step (after the surface planarization step if it is performed) to obtain an anisotropically conductive member precursor.

In the production method of the invention, the protrusions of the conductive paths formed by the conductive path-protruding step prevent the conductive paths from collapsing or cohering together during the dissolution of the anodized film in the film removal step to be described later and the finally obtained anisotropically conductive member can be used in the joining portion with the electrode portion of an electronic component.

In the conductive path-protruding step, the treatment (a) or (b) is preferably carried out.

Treatment (a) in which part of the anodized film at the front surface and/or back surface of the microstructure after the conductive material filling step is removed to form the structure having the conductive paths protruding from the front surface and/or back surface of the microstructure.

Treatment (b) in which a conductive material is deposited on the surfaces of the conductive paths in the microstructure having undergone the conductive material filling step to form the structure having protrusions of the conductive material from the front surface and/or back surface of the microstructure.

The respective treatments (a) and (b) are described below in detail.

[Treatment (a)]

In the treatment (a), the front surface and/or back surface of the microstructure having undergone the conductive material filling step is brought into contact with an aqueous acid solution or an aqueous alkaline solution to dissolve and remove only part of the anodized film at the front surface and/or back surface of the microstructure to protrude the conductive paths (FIG. 4(C)).

The treatment (a) can be carried out under the same treatment conditions as those of the above-described oxide film dissolution treatment (E) as long as the conductive material making up the conductive paths is not dissolved. It is preferred to use an aqueous acid solution or an aqueous alkali solution with which the dissolution rate is readily controlled.

[Treatment (b)]

In the treatment (b), the conductive material is only deposited on the surfaces of the conductive paths 3 shown in FIG. 4(B) to protrude the conductive paths (FIG. 4(D)).

The conductive material can be deposited by electroless plating or electrodeposition. The conductive material to be deposited may be the same as or different from the one filled in the conductive material filling step.

In the production method of the invention, the treatment (a) is preferably carried out in the conductive path-protruding step, and the microstructure having undergone the conductive material filling step is more preferably subjected to immersion using a treatment solution for dissolving the anodized film.

Specific examples of the treatment solution that may be used when the conductive paths are filled with copper include aqueous alkali solutions at a pH of at least 13 such as KOH and NaOH aqueous solutions.

The immersion is preferably carried out at a temperature of 0° C. to 70° C., more preferably 10° C. to 50° C. and even more preferably 20° C. to 45° C.

The immersion time also varies with the diameter and pitch of the conductive paths but is preferably in a range of 1 to 60 minutes in terms of the workability and practical utility. At a treatment time within the foregoing range, good reproducibility is also achieved.

On the other hand, when the conductive paths are filled with a metal having high acid resistance such as a noble metal, aqueous solutions of acids such as phosphoric acid, sulfuric acid and nitric acid may also be used for the treatment solution.

In this case, the treatment solution preferably has a pH of −1.0 to 3.0, more preferably −0.5 to 2.0 and even more preferably 0 to 1.5.

In this case, the immersion is preferably carried out at a temperature of 0° C. to 70° C., more preferably 10° C. to 50° C. and even more preferably 20° C. to 45° C.

In this case, the immersion time also varies with the diameter and pitch of the conductive paths but is preferably in a range of 1 to 60 minutes in terms of the workability and practical utility. At a treatment time within the foregoing range, good reproducibility is also achieved.

It is preferred to increase the viscosity of the treatment solution by the addition of a water-soluble polymer.

The water-soluble polymer is added to increase the viscosity, whereby the height of the portion (bump) of each conductive path protruding from the surface of the insulating base and the aspect ratio (height/diameter) of the bump can be easily adjusted to 0.05-30 μm and at least 1, respectively.

More specifically, water-soluble polymers such as polyethylene glycol (PEG), polyvinyl alcohol (PVA), sodium polyacrylate, glycerol and propylene glycol are preferred in terms of the availability, stability and purity.

The water-soluble polymer preferably has a molecular weight of 40 to 5,000, more preferably 60 to 4,000 and even more preferably 80 to 3,000.

The viscosity after the addition of the water-soluble polymer is preferably 1.2 to 12 cp, more preferably 2 to 6 cp, even more preferably 2 to 5 cp and most preferably 2.5 to 4.8 cp. At a viscosity within the foregoing range, the treatment solution permeates the interfaces between the insulating base and the conductive paths to prevent the structural collapse of the microstructure, thus enabling the protrusions of the conductive paths to have higher heights.

This conductive path-protruding step yields a precursor 21 of the anisotropically conductive member shown in FIG. 4(C) or 4(D).

[Resin Coating Step]

The resin coating step is a step in which at least part of the front surface or back surface of the precursor of the anisotropically conductive member is coated with a solvent-soluble resin after the conductive path-protruding step.

The solvent-soluble resin as used herein refers to a resin which is soluble in solvents but is insoluble in the alumina dissolving solution for use in the film removal step to be described later, and is soluble in a solvent in which the resin for use in the resin filling step to be described later (solvent-insoluble resin) cannot be dissolved.

Examples of the solvent-soluble resin include resists for photolithography and waxes for polishing.

XP FILM TRIAL (SU-8 3000 available from Kayaku MicroChem Corporation) which is soluble in methyl isopropyl ketone and ALCOWAX (Type 5402F available from Nikka Seiko Co., Ltd.) which is soluble in isopropyl alcohol may also be used.

Figure 5:
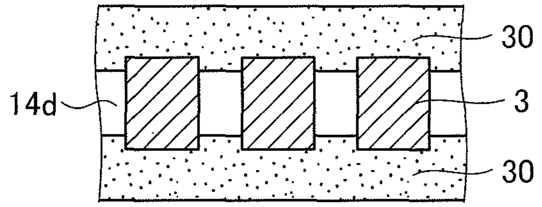
FIG. 5 shows schematic cross-sectional views for illustrating a resin coating step and other steps in the manufacturing method of the invention.
Figure 5:
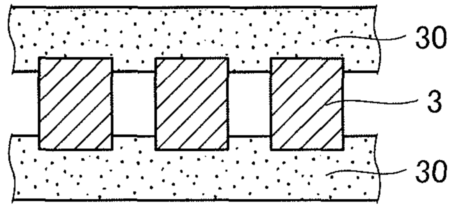
Figure 5:
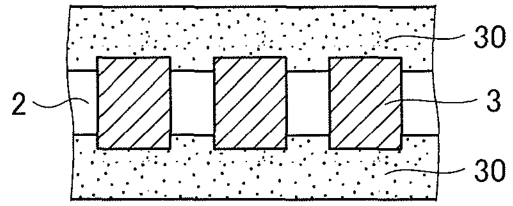
Figure 5:
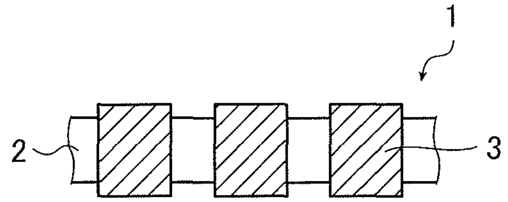
Figure 6:
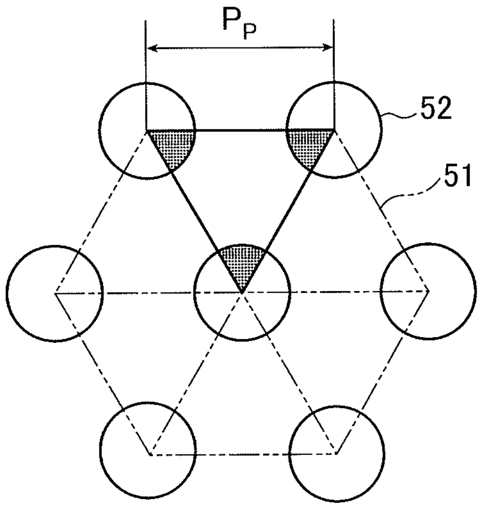
FIG. 6 is a view illustrating how to compute the density of conductive paths of the anisotropically conductive member.

This resin coating step yields a structure shown in FIG. 5(A).

In the production method of the invention, the front surface and the back surface of the anisotropically conductive member precursor are preferably wholly covered with a solvent-soluble resin 30 as shown in FIG. 5(A) but at least part of the front surface or the back surface of the anisotropically conductive member precursor need only be covered with the solvent-soluble resin as long as the function of preventing the conductive paths from collapsing or cohering together during the dissolution of the anodized film in the film removal step to be described later is not impaired.

In the production method of the invention, the whole surfaces including not only the front surface and the back surface of the anisotropically conductive member precursor but also their side surfaces may be coated with the solvent-soluble resin 30 in the resin coating step but in this case, the side surfaces of the anisotropically conductive member precursor from which the dissolution of the anodized film starts in the film removal step to be described later, should be opened by polishing or other treatment so as to be exposed.

[Film Removal Step]

The film removal step is a step in which the anodized film of the anisotropically conductive member precursor is removed after the resin coating step.

The anodized film may be removed under the same conditions as those of the above-described film removal treatment (B).

Of those alumina dissolving solutions described in the film removal treatment (B), an aqueous solution containing any of sodium hydroxide, potassium hydroxide and phosphoric acid is preferred in terms of preventing the solvent-soluble resin from being dissolved.

In the production method of the invention, the anisotropically conductive member precursor having undergone the resin coating step is preferably in the shape of a strip in terms of the solubility of the anodized film in the film removal step. More specifically, the anisotropically conductive member precursor is more preferably in the form of a strip having a long side length of about 5 to 100 mm and a short side length of about 1 to 10 mm.

When the anisotropically conductive member precursor is in the form of a strip, the alumina dissolving solution easily permeates the whole of the anodized film from the lateral sides of the anisotropically conductive member precursor.

This film removal step yields a structure shown in FIG. 5(B) in which the conductive paths 3 are fixed by the solvent-soluble resin 30.

[Resin Filling Step]

The resin filling step is a step in which portions of the anisotropically conductive member precursor where the anodized film was previously present is filled with a solvent-insoluble resin after the film removal step to form the insulating base.

The solvent-insoluble resin to be filled makes up the insulating base of an anisotropically conductive member as described in connection with the anisotropically conductive member of the invention. Of those solvent-insoluble resins, thermosetting resins such as epoxy resin, unsaturated polyester resin and polyimide resin are preferred because of small changes in the volume after curing.

The filling of the solvent-insoluble resin can be performed under increased or reduced pressure but a method which involves impregnating the precursor with a chemical solution containing the solvent-insoluble resin while gradually reducing the pressure with a vacuum pump is preferred.

The resin filling step yields a structure shown in FIG. 5(C) in which spaces formed by the conductive paths 3 and the solvent-soluble resin 30 are filled with the solvent-insoluble resin to form the insulating base 2.

[Resin Removal Step]

The resin removal step is a step in which the solvent-soluble resin is removed after the resin filling step to obtain the anisotropically conductive member.

The solvent-soluble resin is removed with a solvent but as described above, a solvent in which the solvent-insoluble resin filled in the resin filling step is insoluble is used.

This resin removal step yields the anisotropically conductive member 1 shown in FIG. 5(D) from which the solvent-soluble resin 30 is removed.

EXAMPLES

Example 1

(A) Mirror-Like Finishing Treatment

A high-purity aluminum substrate (Sumitomo Light Metal Industries, Ltd.; purity, 99.99 wt %; thickness, 0.4 mm) was annealed at 400° C. for 1 hour and cut to a size of 1 cm×3 cm so that anodization may be carried out in an area of 1 cm square, then subjected to mechanical polishing and electrolytic polishing.

[Mechanical Polishing]

First, a sample of the high-purity aluminum substrate with a size of 1 cm×3 cm was stuck to a mirror-finished metal block with double faced tape (removable tape 9455; Sumitomo 3M Limited).

Then, the sample was polished in a polishing machine (commercial name: LaboPol-5, Marumoto Struers K.K.) while increasing the grit size from 80 to 1,500 until the topographic features cannot be seen.

Then, the buffing wheel was supplied with diamond slurry with an average particle size of 1 μm and the sample surface was mirror-finished.

[Electrolytic Polishing]

Mechanical polishing was followed by electrolytic polishing using the electrolytic polishing solution of the composition indicated below under conditions of a current density of 5 A/dm$^2$, a solution temperature of 65° C. and a solution flow velocity of 3.0 m/min to remove the layer altered by the treatment.

A carbon electrode was used as the cathode, and a GP0110-30R unit (Takasago, Ltd.) was used as the power supply. In addition, the flow velocity of the electrolytic solution was measured using a vortex flow monitor FLM22-10PCW manufactured by As One Corporation.

(Electrolytic Polishing Solution Composition)

| | |
|---|---|
| 85 wt % Phosphoric acid (Wako Pure Chemical Industries, Ltd.) | 660 mL |
| Pure water | 160 mL |
| Sulfuric acid | 150 mL |
| Ethylene glycol | 30 mL |

(B) Anodizing Treatment Step

A transfer apparatus (MODEL 6000; HiSOL Inc.) was used to transfer six times a pattern of topographic features of a SiC mold having protrusions arranged in a square array at a pitch of 100 nm (size: 5 mm square; pattern area: 3 mm×0.5 mm; special order product manufactured by NTT Advanced Technology Corporation) to the surface of the aluminum substrate having undergone electrolytic polishing treatment with positional changes of the mold to thereby prepare a transfer region with a size of 3 mm square. The pattern was transferred at room temperature at a transfer pressure set to 256 N/cm$^2$ per area of the protrusions.

Then, the front surface except the transfer region with a size of 3 mm square and the back surface in the aluminum substrate were masked with a commercial masking tape.

Then, anodization was carried out in an electrolytic solution containing 0.2 mol/L of phosphoric acid for 16 hours under conditions of a voltage of 195 V, a solution temperature of 0° C. and a solution flow velocity of 5.0 m/min.

Anodizing treatment was performed using a stainless steel electrode as the cathode and using a GP0110-30R unit (Takasago, Ltd.) as the power supply. Use was made of NeoCool BD36 (Yamato Scientific Co., Ltd.) as the cooling system, and Pairstirrer PS-100 (Tokyo Rikakikai Co., Ltd.) as the stirring and warming unit. In addition, the flow velocity of the electrolytic solution was measured using the vortex flow monitor FLM22-10PCW (As One Corporation).

(C) Perforating Treatment Step

A treatment solution was obtained by blending 0.1 mol/L of copper chloride into a 20% aqueous hydrochloric acid solution and the aluminum substrate was dissolved by immersion in the resulting treatment solution at a solution temperature of 15° C. until the removal of aluminum is visually confirmed. The anodized film was further immersed in an aqueous solution containing 0.1 mol/L of potassium hydroxide at a solution temperature of 30° C. for 30 minutes to remove the bottom of the anodized film, thereby preparing a microstructure including the anodized film having diameter-enlarged micropores.

A surface image and a cross-sectional image of the microstructure obtained after the perforating treatment was taken by FE-SEM at a magnification of 20,000× and the microstructure was found to have the following shape:

Thickness of the structure: 70 μm;

Depth of the through micropores: 70 μm;

Average aperture size of the through micropores: 200 nm;

Pitch (center-to-center distance) between neighboring through micropores: 500 nm;

Degree of ordering of through micropores (micropores): 100%.

The pitch of the through micropores refers to the center-to-center distance (pitch) between adjacent through micropores which is obtained by calculating the average of 50 measurements.

The degree of ordering of the through micropores (micropores) is a measured value of the degree of ordering as defined by formula (i).

(D) Heating Treatment

Then, the structure obtained as above was heated at a temperature of 400° C. for 1 hour.

(E) Conductive Material Filling Step

Next, a nickel electrode was closely attached to one surface of the heated structure and electrolytic plating was carried out using the nickel electrode as the cathode and platinum as the anode.

Nickel sulfate (300 g/L) held at 60° C. was used as the electrolytic solution to carry out constant-voltage pulse electrolysis, thereby manufacturing a microstructure having the through micropores filled with nickel.

An electroplating system manufactured by Yamamoto-MS Co., Ltd. and a power supply (HZ-3000) manufactured by Hokuto Denko Corp. were used to carry out constant-voltage pulse electrolysis. The deposition potential was checked by carrying out cyclic voltammetry in the plating solution, following which the film side potential was set to −2 V and electrolysis was carried out. The pulse waveform in constant-voltage pulse electrolysis was a square waveform. Specifically, electrolysis treatment lasting 300 seconds was repeated a total of six times with 40-second rest periods between the respective treatments, so as to provide a total electrolysis treatment time of 1800 seconds.

The surface after the filling with nickel was observed by FE-SEM and the nickel was found to be filled into the through micropores in such an amount that the height from the gold electrode side may be about 80 μm and to overflow on the surface in an amount of 10 μm.

(F) Surface Planarization Treatment

Then, the microstructure having undergone the conductive material filling step was subjected to mechanical polishing treatment to remove the nickel which overflowed on the surface. Then, surface planarization treatment including polishing the gold electrode side surface to a depth of 2 μm and polishing the opposite surface to a depth of 8 μm was carried out.

The fracture surface of the structure having undergone surface planarization treatment was observed with an optical microscope and the structure was found to be smooth and to have conductive paths (nickel) and the anodized film each having a thickness of 60 μm.

(G) Conductive Path-Protruding Step

Then, both the surfaces of the microstructure having undergone surface planarization treatment was immersed in an aqueous solution containing 30 wt % of PEG (molecular weight: 1,000) adjusted with KOH to a pH of 12.7 at 40° C. for 30 minutes.

The fracture surface of the treated microstructure was observed by FE-SEM and the microstructure was found to be an anisotropically conductive member precursor having protrusions of the conductive paths formed on both sides thereof. The protrusions had a height of 7 μm and an aspect ratio (height/diameter) of 35.

(H) Resin Coating Step

Then, the anisotropically conductive member precursor having undergone the conductive path-protruding step was immersed in ALCOWAX in liquid form at a temperature of 70° C. (type: 5402F; dissolved in isopropyl alcohol; Nikka Seiko Co., Ltd.) for 1 minute.

Then, the front and back surfaces of the prepared structure was sandwiched between flat graphite sheets before the wax is solidified, and the structure was allowed to stand for 30 minutes under a pressure of 50 $kg/m^2$ and cooled to prepare a structure having the whole surfaces covered with the solidified wax.

The side surfaces of the anodized film were exposed using a semiconductor dicing apparatus as shown in FIG. 5(A) in order to have the dissolution of the anodized film start from the side surfaces in the film removal step to be described later. The structure after the exposure of the anodized film was cut to a size of 2 mm square and the graphite portions provided on the front surface and back surface thereof were not cut out for the use as a handling substrate.

(I) Film Removal Step

Then, in order to dissolve not the nickel filled in the conductive material filling step and the ALCOWAX coated in the resin coating step but only the anodized film, the structure having undergone the resin coating step was immersed in 1 mol/L aqueous potassium hydroxide solution at room temperature for 4 days to completely dissolve only the anodized film from the faces cut by dicing (side surfaces).

(J) Resin Filling Step

Then, the structure after the removal of the anodized film in the film removal step was rinsed with water and dried, and portions where the anodized film had been previously present were filled with methacrylate resin.

More specifically, a vessel containing the structure naturally dried after the rinsing with water was evacuated by a rotary pump and a resin solution of methyl methacrylate (MMA) containing 1% benzoyl peroxide as a polymerization promoter was added dropwise to and embedded in the portions where the anodized film had been present to carry out polymerization at 60° C. for 2 days.

(K) Resin Removal Step

The structure having undergone the resin filling step was immersed in isopropyl alcohol heated to 50° C. for 2 hours to dissolve the ALCOWAX coated in the resin coating step to thereby prepare an anisotropically conductive member.

A surface image and a cross-sectional image of the anisotropically conductive member obtained in Example 1 was taken by FE-SEM at a magnification of 20,000× and the anisotropically conductive member was found to have the following shape:

Thickness of the insulating base: 46 μm;

Diameter of the conductive paths: 200 nm;

Bump height of the conductive paths: 7 μm;

Aspect ratio (height/diameter) of the bumps of the conductive paths: 35.

The density of the conductive paths of the anisotropically conductive member obtained in Example 1 was calculated by the following formula assuming that the unit cell 51 of micropores arranged so that the order of ordering as defined by formula (I) may be 100% contains a half of the conductive electrode portion 52 and the density calculated was 4,620,000 conductive paths/$mm^2$.

In the following formula, Pp represents the pitch.

$$\text{Density}[\text{conductive paths}/\mu m^2]=(1/2)/\{Pp(\mu m)\times Pp(\mu m)\times\sqrt{3}\times(1/2)\}$$

Example 2

The structure obtained by removing the anodized film after the treatments (A) to (I) were carried out as in Example 1 was rinsed with water and dried, and portions where the anodized film had been previously present were filled with polyester resin.

More specifically, a vessel containing the structure rinsed with water was evacuated by a rotary pump and an unsaturated polyester resin containing 1% benzoyl peroxide as a curing agent (mountant for use in electron microscopes; Okenshoji Co., Ltd.) was added dropwise to and embedded in the portions where the anodized film had been present to carry out polymerization at 60° C. for 2 days.

Then, (K) resin removal was carried out in the same manner as in Example 1 to prepare an anisotropically conductive member.

A surface image and a cross-sectional image of the anisotropically conductive member obtained in Example 2 was taken by FE-SEM at a magnification of 20,000× and the anisotropically conductive member was found to have the following shape:

Thickness of the insulating base: 46 μm;

Diameter of the conductive paths: 200 nm;

Bump height of the conductive paths: 7 μm;

Aspect ratio (height/diameter) of the bumps of the conductive paths: 35.

The density of the conductive paths in the anisotropically conductive member obtained in Example 2 was calculated in the same manner as in Example 1. The density calculated was 4,620,000 conductive paths/$mm^2$.

Comparative Example 1

The treatments (A) to (G) were carried out by the same method as in Example 1 to prepare an anisotropically conductive member precursor.

The anisotropically conductive members obtained in Examples 1 and 2 and the anisotropically conductive member precursor obtained in Comparative Example 1 were contacted with various substrates shown in Table 1 on which electrodes with a size of 20 μm square had been formed at a pitch of 40 μm to check whether or not there was electrical continuity and the load per total area of electrodes capable of electrical continuity was measured. The results are shown in Table 2.

Whether or not electrical continuity was established was checked, and in Table 2, the samples were rated "good" when electrical continuity could be established, "fair" when there was individual variability in electrical continuity, and "poor" when electrical continuity could not be established. As for the load, hyphen (-) indicates that the substrate was broken before electrical continuity was established.

TABLE 1

| Substrate No. | Material of substrate | Height of electrode [μm] | Tolerance of electrode height [μm] |
|---|---|---|---|
| 1 | Glass epoxy | 50 | ±6 |
| 2 | Glass epoxy | 50 | ±6 |
| 3 | Resin | 50 | ±6 |
| 4 | Ceramic | 50 | ±6 |
| 5 | Silicon | 50 | ±6 |

TABLE 2

| | Substrate | Electrical continuity | Load per total area of electrodes capable of electrical continuity [$N/mm^2$ = Mpa] |
|---|---|---|---|
| Example 1 | Glass epoxy | Good | 100 |
| | Glass | Good | 60 |
| | Resin | Good | 10 |
| | Ceramic | Good | 15 |
| | Silicon | Good | 15 |
| Example 2 | Glass epoxy | Good | 120 |
| | Glass | Good | 100 |
| | Resin | Good | 50 |
| | Ceramic | Good | 75 |
| | Silicon | Good | 75 |
| Comparative Example 1 | Glass epoxy | Poor | — |
| | Glass | Poor | — |
| | Resin | Good | 50 |
| | Ceramic | Fair | 150 |
| | Silicon | Good | 100 |

The results shown in Table 2 revealed that the anisotropically conductive member (precursor) in which the insulating member was made of an anodized film cannot establish electrical continuity with the electrode provided on a glass epoxy substrate or a glass substrate and the load also had a tendency to increase in the electrode substrates with which electrical continuity was established (Comparative Example 1).

On the other hand, it was revealed that, in the anisotropically conductive members in which the insulating member was made of a resin material, electrical continuity with any of the electrode substrates could be established and the load also had a tendency to be lower than that in Comparative Example 1 (Examples 1 and 2).

INDUSTRIAL APPLICABILITY

The anisotropically conductive member of the invention may be used as an inspection connector when carrying out functional inspections of semiconductor devices and other electronic components but may also be used in combination with or by integration with a probe card which is a conventionally known semiconductor tester as also shown in Examples.

The anisotropically conductive member of the invention may also be used as an electric contact (electronically connecting member) between a CPU motherboard and an interposer or as an electric contact between an interposer and a silicon wafer.

In such cases, it is also possible to use it as an inspection probe by combining the film of the invention with a substrate provided with a signal output pad instead of a probe.

By integrating the anisotropically conductive member of the invention on the signal output surface of a silicon wafer, electric signals can be output without damage to the interconnect structure or need for very precise alignment in terms of the production method.

Figure 7:
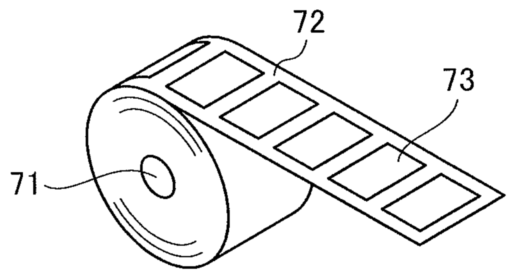
FIG. 7 is a schematic view illustrating an example as to how the anisotropically conductive member of the invention is supplied.

Particularly when used as an electronically connecting member, the anisotropically conductive member of the invention can be supplied in the form in which an anisotropically conductive member 73 of a specified size is stuck to the outside surface of a tape (mount) 72 wound around a coil core 71 having specified diameter and width, as in a label on a product indicating the price or the date (see FIG. 7).

The anisotropically conductive member should have substantially the same size as that of a semiconductor chip which uses the anisotropically conductive member and the tape width may be appropriately determined according to the width of the anisotropically conductive member.

The substrate of the anisotropically conductive member is made of alumina and is difficult to cut or bend later and it is therefore desirable to appropriately determine the diameter and the width of the coil core depending on the size of the anisotropically conductive member. More specifically, it is desirable to increase the diameter of the coil core with increasing the size of the anisotropically conductive member in the tape length direction.

The anisotropically conductive member is stuck to the tape, but the tape is preferably made of a material which prevents the adhesive from remaining on the surface of the anisotropically conductive member when it is peeled off.

In this supply form, users can peel off the anisotropically conductive films stuck to the tape one by one and used.

Figure 8:
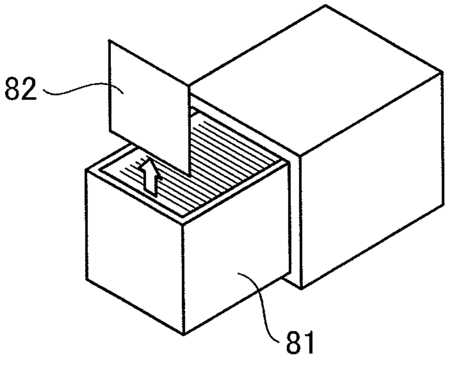
FIG. 8 is a schematic view illustrating an example as to how the anisotropically conductive member of the invention is supplied.

When used as an electronically connecting member, the anisotropically conductive member of the invention can also be supplied in a state in which anisotropically conductive members 82 of a specified size are vertically arranged in a drawer type box 81 (see FIG. 8).

The size of the box may be appropriately changed according to the size of the anisotropically conductive member.

The neighboring anisotropically conductive members come into contact with each other within the box. Therefore, the anisotropically conductive members are desirably put in the box so as to prevent the neighboring anisotropically conductive members from coming into contact with each other by inserting a cushioning material therebetween or packaging individual anisotropically conductive members.

In this supply form, users can take out the anisotropically conductive films from the box one by one and used.

Figure 9:
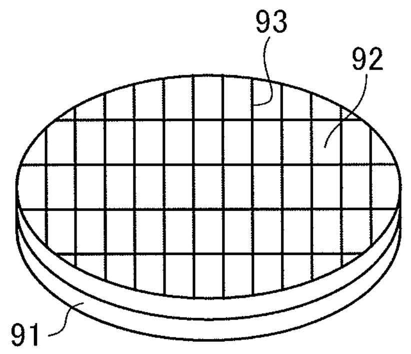
FIG. 9 is a schematic view illustrating an example as to how the anisotropically conductive member of the invention is supplied.

Particularly when used as an electronically connecting member, the anisotropically conductive member of the invention can also be supplied as in a semiconductor wafer in a state in which an anisotropically conductive member 92 is stuck to the whole surface on one side of a substantially circular resin plate 91 with a predetermined diameter (see FIG. 9).

The diameter of the resin plate may be set to be substantially the same as that of a semiconductor wafer which uses the anisotropically conductive film, say 5 inches or 8 inches.

As in, for example, the wafer level chip size packages of semiconductor chips, slits 93 are desirably made in advance in the anisotropically conductive member and the resin plate so that they can be used after having been cut to a size which is substantially the same as that of semiconductor chips.

In this supply form, the anisotropically conductive film can be used after the anisotropically conductive film stuck on the whole surface on one side of the resin plate was cut together with the resin plate along the slits into individual segments and the resin plate is removed from the segments.

In cases where the anisotropically conductive member of the invention is used as a connection member between individual semiconductor chips and an interposer, the semiconductor wafer and the interposer may also be previously connected via the anisotropically conductive film before being supplied.

In addition, the anisotropically conductive member of the invention can be expected to be applied to optical transmission materials.

| DESCRIPTION OF SYMBOLS | |
|---|---|
| 1 | anisotropically conductive member |
| 2 | insulating base |
| 3 | conductive path |
| 4a, 4b | protrusion |
| 5 | conductive portion within the base |
| 6 | thickness of the insulating base |
| 7 | width between neighboring conductive paths |
| 8 | diameter of the conductive path |
| 9 | center-to-center distance (pitch) between neighboring conductive paths |
| 12 | aluminum substrate |
| 14a, 14b, 14c, 14d | anodized film |
| 16a, 16b, 16c, 16d | micropore |
| 18a, 18b, 18c, 18d | barrier layer |
| 20 | microstructure |
| 21 | anisotropically conductive member precursor |
| 30 | solvent-soluble resin |
| 51 | micropore unit cell |
| 52 | conductive electrode portion |
| 71 | coil core |
| 72 | tape (mount) |
| 73, 82, 92 | anisotropically conductive member |
| 81 | box |
| 91 | resin plate |
| 93 | slit |
| 101, 102, 104, 105, 107, 108 | micropore |
| 103, 106, 109 | circle |

The invention claimed is:

1. A method for producing an anisotropically conductive member, comprising, at least:

(1) an anodizing treatment step in which an aluminum substrate is anodized to form an anodized film;

(2) a perforating treatment step in which micropores formed by anodization are perforated after the anodizing treatment step to obtain a microstructure;

(3) a conductive material filling step in which a conductive material is filled into through micropores in the resulting microstructure after the perforating treatment step to form the conductive paths;

(4) a conductive path-protruding step in which the conductive paths are protruded from a front surface or back surface of the microstructure after the conductive material filling step to obtain an anisotropically conductive member precursor;

(5) a resin coating step in which at least part of the front surface or the back surface of the anisotropically conductive member precursor is coated with a solvent-soluble resin after the conductive path-protruding step;

(6) a film removal step in which the anodized film of the anisotropically conductive member precursor is removed after the resin coating step;

(7) a resin filling step in which a portion in which the anodized film was formed is filled with a solvent-insoluble resin after the film removal step to form the insulating base; and (8) a resin removal step in which the solvent-soluble resin is removed after the resin filling step to obtain the anisotropically conductive member, wherein the anisotropically conductive member comprises an insulating base and a plurality of conductive paths made of a conductive material, insulated from one another, and extending through the insulating base in a thickness direction of the insulating base, one end of each of the conductive paths protruded on one side of the insulating base, the other end of each of the conductive paths exposed or protruded on the other side thereof, and wherein the insulating base is made of a resin material and the conductive paths are formed at a density of at least 1,000,000 conductive paths/$mm^2$.

2. The method for producing the anisotropically conductive member according to claim 1, wherein, in the anisotropically conductive member, protrusions of the conductive paths from a surface of the insulating base have a height of 0.05 to 30 μm and an aspect ratio (height/diameter) of at least 1.

* * * * *